(12) United States Patent
Himori et al.

(10) Patent No.: US 8,604,350 B2
(45) Date of Patent: *Dec. 10, 2013

(54) MULTILAYER WIRING SUBSTRATE AND MANUFACTURING METHOD OF MULTILAYER WIRING SUBSTRATE

(75) Inventors: Tsuyoshi Himori, Osaka (JP); Shogo Hirai, Osaka (JP); Hiroyuki Ishitomi, Osaka (JP); Satoru Tomekawa, Kyoto (JP); Yutaka Nakayama, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/143,490

(22) PCT Filed: Feb. 22, 2011

(86) PCT No.: PCT/JP2011/000985
§ 371 (c)(1),
(2), (4) Date: Jul. 6, 2011

(87) PCT Pub. No.: WO2011/105050
PCT Pub. Date: Sep. 1, 2011

(65) Prior Publication Data
US 2011/0278051 A1    Nov. 17, 2011

(30) Foreign Application Priority Data

Feb. 25, 2010 (JP) ................................ 2010-040539
Feb. 25, 2010 (JP) ................................ 2010-040540
Sep. 27, 2010 (JP) ................................ 2010-215851

(51) Int. Cl.
*H05K 1/09* (2006.01)
*H05K 1/11* (2006.01)
*H01K 3/10* (2006.01)

(52) U.S. Cl.
USPC .............. 174/257; 174/261; 174/263; 29/853

(58) Field of Classification Search
USPC ................. 174/257, 264, 261, 262, 263, 265; 29/853; 439/65
See application file for complete search history.

(56) References Cited

U.S. PATENT DOCUMENTS 5,890,915 A * 4/1999 Reylek ............................ 439/91
5,948,533 A * 9/1999 Gallagher et al. ............ 174/255

(Continued)

FOREIGN PATENT DOCUMENTS

EP      0 793 405 A2    9/1997
EP      1 408 726 A1    4/2004

(Continued)

OTHER PUBLICATIONS

European Search Report issued in European Patent Application No. EP 11728763.1 dated Dec. 16, 2011.

(Continued)

*Primary Examiner* — Timothy Thompson
*Assistant Examiner* — Roshn Varghese
(74) *Attorney, Agent, or Firm* — McDermott Will & Emery LLP

(57) ABSTRACT

A multilayer wiring board includes an insulating resin layer, wirings laid on their respective opposite surfaces of the insulating resin layer, and a via-hole conductor for electrically connecting the wirings. The via-hole conductor includes metal and resin portions. The metal portion includes first metal regions including a joined unit made of copper particles for connecting the wirings, second metal regions mainly composed of, for example, tin, a tin-copper alloy, or a tin-copper intermetallic compound, and third metal regions mainly composed of bismuth and in contact with the second metal regions. The copper particles forming the joined unit are in plane contact with one another to form plane contact portions, and the second metal regions at least partially are in contact with the first metal regions.

15 Claims, 18 Drawing Sheets

(56) References Cited

U.S. PATENT DOCUMENTS

| | | |
|---|---|---|
| 6,326,555 B1 | 12/2001 | McCormack et al. |
| 6,574,114 B1* | 6/2003 | Brindle et al. ............ 174/262 |
| 6,774,316 B1* | 8/2004 | Suzuki et al. ............ 174/262 |
| 7,390,442 B2* | 6/2008 | Kashihara et al. ............ 252/512 |
| 7,427,717 B2* | 9/2008 | Morimoto et al. ............ 174/254 |
| 2002/0066961 A1* | 6/2002 | Tomekawa et al. ............ 257/776 |
| 2003/0234277 A1* | 12/2003 | Dias et al. ............ 228/180.22 |
| 2005/0011677 A1 | 1/2005 | Yoshino et al. |
| 2005/0172483 A1 | 8/2005 | Sugita et al. |
| 2005/0257952 A1* | 11/2005 | Morimoto et al. ............ 174/256 |

FOREIGN PATENT DOCUMENTS

| | | |
|---|---|---|
| JP | 10-007933 | 1/1998 |
| JP | 2000-049460 | 2/2000 |
| JP | 2002-094242 | 3/2002 |
| JP | 2002-290052 | 10/2002 |
| JP | 2004-265607 | 9/2004 |
| JP | 2005-136034 | 5/2005 |
| JP | 2009-147026 | 7/2009 |

OTHER PUBLICATIONS

Office Action issued in corresponding U.S. Appl. No. 13/698,539, mailed May 9, 2013.

Office Action issued in U.S. Appl. No. 13/700,999, dated Aug. 13, 2013.

* cited by examiner

← 10μm →

ELEMENT: Bi

Bi ELEMENT

MULTILAYER WIRING SUBSTRATE AND MANUFACTURING METHOD OF MULTILAYER WIRING SUBSTRATE

RELATED APPLICATIONS

This application is the U.S. National Phase under 35 U.S.C. §371 of International Application No. PCT/JP2011/000985, filed on Feb. 22, 2011, which in turn claims the benefit of Japanese Application No. 2010-040539, filed on Feb. 25, 2010, Japanese Application No. 2010-040540, filed on Feb. 25, 2010 and Japanese Application No. 2010-215851, filed on Sep. 27, 2010 the disclosures of which Applications are incorporated by reference herein.

TECHNICAL FIELD

The present invention relates to a multilayer wiring board with via-hole conductors for interlayer connection between two wirings three-dimensionally formed on an insulating resin layer. More specifically, it relates to improvements in via-hole conductors for interlayer connection between wirings in multiple layers.

BACKGROUND ART

Conventionally, there is a known multilayer wiring board obtained by interlayer connection between two wirings three-dimensionally formed on an insulating resin layer. For such an interlayer connection method, there is a known via-hole conductor as formed by filling a hole provided in an insulating resin layer with conductive paste. In another known via-hole conductor, metallic particles containing copper (Cu) are applied instead of the conductive paste, and fixed together by an intermetallic compound.

Concretely, for example, Patent Document 1 below discloses a via-hole conductor having a matrix-domain structure in which a plurality of domains made of Cu particles are dotted in a CuSn compound matrix.

Also, for example, Patent Document 2 below discloses a sinterable composition for use in via-hole conductor formation, which includes a high-melting-point particle-phase material that includes Cu, and a low-melting-point material that is a selected metal such as tin (Sn) or a tin alloy. Such a sinterable composition is a composition sinterable in the presence of a liquid phase or a transient liquid phase.

Also, for example, Patent Document 3 below discloses a via-hole conductor material in which alloy layers with a solidus temperature of 250° C. or higher are formed on circumferences of copper particles by heating conductive paste, which contains tin-bismuth (Sn—Bi) metallic particles and the copper particles, to a temperature greater than or equal to the melting point of the Sn—Bi metallic particles. Such a via-hole conductor material is described as achieving high connection reliability since interlayer connection is made by joining alloy layers with a solidus temperature of 250° C. or higher and the alloy layers do not melt in a temperature-cycling test and a reflow resistance test.

Also, for example, Patent Document 4 below discloses a multilayer wiring board provided with via-hole conductors which contain copper and tin in a total amount of 80 to 97% by weight, along with bismuth in a proportion of 3 to 20% by weight.

CITATION LIST

Patent Documents

Patent Document 1: Japanese Laid-Open Patent Publication No. 2000-49460

Patent Document 2: Japanese Laid-Open Patent Publication No. 10-7933

Patent Document 3: Japanese Laid-Open Patent Publication No. 2002-94242

Patent Document 4: Japanese Laid-Open Patent Publication No. 2002-290052

SUMMARY OF INVENTION

Technical Problem

The via-hole conductor disclosed in Patent Document 1 will be described in detail with reference to FIG. 21. FIG. 21 is a schematic cross-sectional view of a connection between a wiring 1 and a via-hole conductor 2 in the multilayer wiring board disclosed in Patent Document 1.

In the schematic cross-sectional view of FIG. 21, the via-hole conductor 2 is in contact with the wiring 1 formed on the surface of the multilayer wiring board. The via-hole conductor 2 includes a matrix, which includes an intermetallic compound 4 such as $Cu_3Sn$ or $Cu_6Sn_5$, and copper-containing powder 3 dotted as domains in the matrix including the intermetallic compound 4. In the via-hole conductor 2, a matrix-domain structure is formed by setting the weight ratio represented as Sn/(Cu+Sn) within the range from 0.25 to 0.75. However, the via-hole conductor 2 as such has a problem where voids and cracks (5 in FIG. 21) tend to occur under thermal shock testing.

When the via-hole conductor 2 is exposed to heat under, for example, thermal shock testing or reflow processing, such voids and cracks are openings caused by Cu diffusion among the Sn—Bi metallic particles to generate a CuSn compound such as $Cu_3Sn$ or $Cu_6Sn_5$. In addition, such voids are also caused by $Cu_3Sn$, which is an intermetallic compound of Cu and Sn contained in a Cu—Sn diffusion joint formed at a Cu—Sn interface, being heated under any of various reliability tests and turning into $Cu_6Sn_5$ to generate internal stress inside the via-hole conductor 2.

Also, the sinterable composition disclosed in Patent Document 2 is a composition which is generated, for example, during hot pressing for prepreg lamination and sintered in the presence or absence of a transient liquid phase. Such a sinterable composition includes Cu, Sn, and lead (Pb) and therefore is difficult to be rendered Pb-free as demanded by the market. In addition, such a sinterable composition reaches a high temperature in the range from 180° C. to 325° C. at the time of hot pressing and therefore is difficult to apply as a standard insulating resin layer (which may also be called a glass epoxy resin layer) to be obtained by impregnating glass fibers with epoxy resin.

Also, the via-hole conductor material disclosed in Patent Document 3 has alloy layers with high resistance formed on surface layers of Cu particles. Accordingly, there is a problem of higher resistance when compared with connection resistance resulting only from contact between Cu particles and between Ag particles as in general conductive paste which contains Cu particles, silver (Ag) powder, etc.

Furthermore, the via-hole conductor disclosed in Patent Document 4 also has alloy layers with high resistance formed on surface layers of Cu particles and therefore has the problem of not being able to achieve interlayer connection with sufficiently low resistance, as will be described later.

An objective of the present invention is to provide a multilayer wiring board capable of meeting the need for being Pb-free, in which interlayer connections are achieved by low-resistance via-hole conductors with high connection reliability.

Solution to Problem

One aspect of the present invention is directed to a multilayer wiring board comprising at least one insulating resin layer, a first wiring laid on a first surface of the insulating resin layer, a second wiring laid on a second surface of the insulating resin layer, and a via hole conductor provided so as to pierce the insulating resin layer for electrically connecting the first wiring and the second wiring, wherein the via-hole conductor includes metal and resin portions, the metal portion includes first metal regions including a joined unit made of copper particles for forming a path electrically connecting the first wiring and the second wiring, second metal regions mainly composed of at least one metal selected from the group consisting of tin, a tin-copper alloy, and a tin-copper intermetallic compound, and third metal regions mainly composed of bismuth and in contact with the second metal regions, the copper particles forming the joined unit are in plane contact with one another to form plane contact portions, and the second metal regions at least partially are in contact with the first metal regions.

Also, another aspect of the present invention is directed to a multilayer wiring board manufacturing method comprising a first step of covering surfaces of an insulating resin sheet with protective films, a second step of forming a through-hole by perforating the insulating resin sheet via either of the protective films, a third step of filling the through-hole with via paste, the via paste including copper particles, tin-bismuth based solder particles, and thermally curable resin, a fourth step of removing the protective films after the third step, thereby revealing protrusions formed by the via paste partially projecting from the through-hole, a fifth step of placing metal foil on at least one surface of the insulating resin sheet so as to cover the protrusions, a sixth step of subjecting the metal foil to compression bonding onto the surface of the insulating resin sheet to compress the via paste by way of the protrusions at a temperature lower than the melting point of the tin-bismuth based solder particles, thereby forming first metal regions including joined units made of the copper particles, the first metal regions including plane contact portions formed by the copper particles in plane contact with one another, and a seventh step of heating the via paste to the melting point of the tin-bismuth based solder particles or higher after the sixth step, thereby generating second metal regions mainly composed of at least one metal selected from the group consisting of tin, a tin-copper alloy, and a tin-copper intermetallic compound, and third metal regions mainly composed of bismuth, wherein the second metal regions are at least partially in contact with the first metal regions, and the third metal regions are in contact with the second metal regions.

Objects, features, aspects, and advantages of the present invention will be more apparent from the following detailed description and the accompanying drawings.

Advantageous Effects of Invention

The present invention makes it possible to achieve interlayer connection with low resistance by forming a low-resistance conduction path using a joined unit made of copper particles and having plane contact portions formed by copper particles contained in via-hole conductors of a multilayer wiring board, which are in plane contact with one another.

Also, the joined unit made of copper particles is reinforced by second metal regions contacting at least part of the joined unit made of copper particles, in which the second metal regions are mainly composed of at least one metal harder than the copper particles and selected from the group consisting of tin, a tin-copper alloy, and a tin-copper intermetallic compound. Thus, the reliability of electrical connection is enhanced.

DESCRIPTION OF EMBODIMENTS

First Embodiment

Figure 1A:
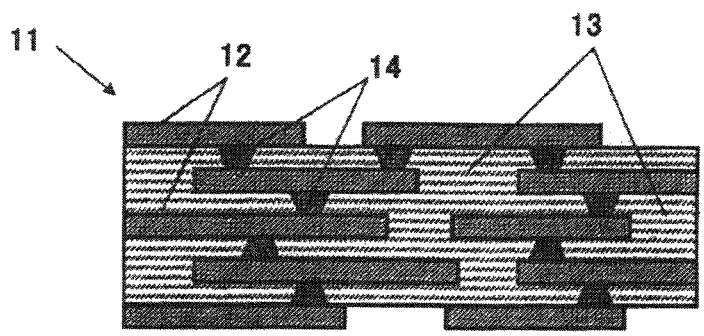
FIG. 1A is a schematic cross-sectional view of a multilayer wiring board 11 in a first embodiment.

FIG. 1A is a schematic cross-sectional view of a multilayer wiring board 11 of the present embodiment. Also, FIG. 1B is an enlarged schematic cross-sectional view around a via-hole conductor 14 in the multilayer wiring board 11 of FIG. 1A.

As shown in FIG. 1A, in the multilayer wiring board 11, via-hole conductors 14 piercing through insulating resin layers 13 provide electrical interlayer connections between a plurality of wirings 12, which are made of metal foil such as copper foil and three-dimensionally formed on the insulating resin layers 13.

Figure 1B:
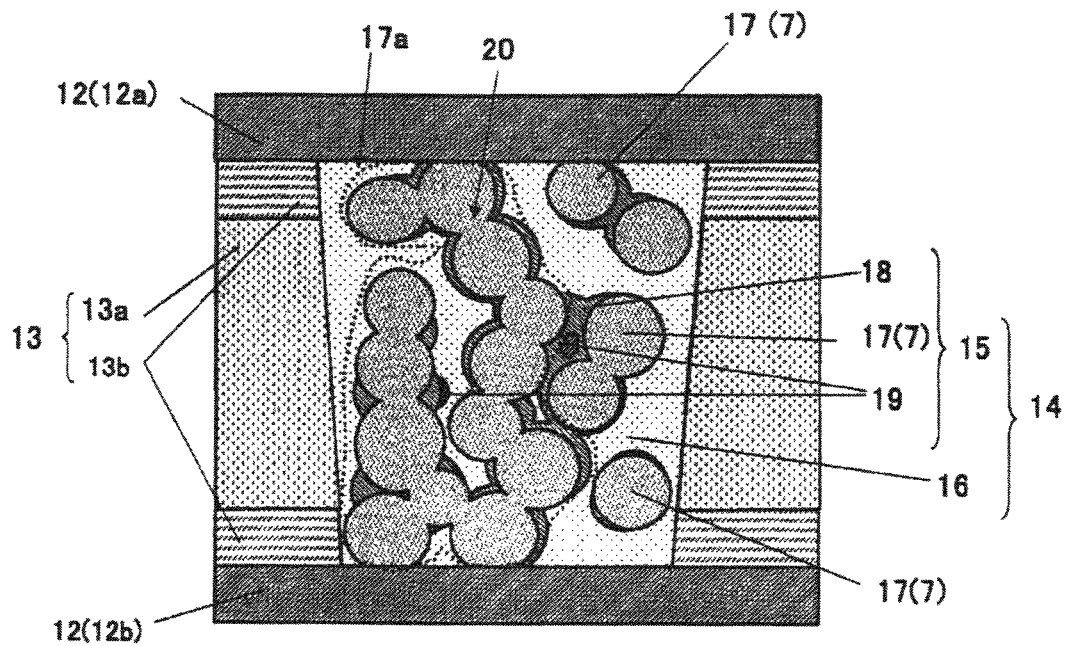
FIG. 1B is an enlarged schematic cross-sectional view around a via-hole conductor 14 in FIG. 1A.

FIG. 1B is an enlarged schematic cross-sectional view around one via-hole conductor 14. In FIG. 1B, "12 (12a, 12b)" denotes the wirings, "13" denotes the insulating resin layer, and "14" denotes the via-hole conductor. The via-hole conductor 14 includes a metal portion 15 and a resin portion 16. The insulating resin layer 13 is made of a laminated heat-resistant resin sheet in which cured resin layers 13b are laminated on opposite surfaces of a heat-resistant resin sheet 13a. The metal portion 15 includes first metal regions 17 formed of Cu particles 7, second metal regions 18 mainly composed of at least one metal selected from the group consisting of tin, a tin-copper alloy, and a tin-copper intermetallic compound, and third metal regions 19 mainly composed of Bi. At least part of the Cu particles 7 are brought into contact and joined together by plane contact portions 20 in which they are in direct plane contact with one another, thereby forming a copper-particle joined unit 17a in a portion denoted by broken lines. Furthermore, the joined unit 17a functions as a low-resistance conduction path for electrically connecting the upper-layer wiring 12a and the lower-layer wiring 12b.

The Cu particles 7 have an average particle diameter in the range preferably from 0.1 to 20 μm, more preferably from 1 to 10 μm. In the case where the average particle diameter of the Cu particles 7 is excessively small, the number of contact points in the via-hole conductors 14 tends to increase, resulting in higher conduction resistance. Furthermore, particles with such a particle diameter tend to be expensive. On the other hand, in the case where the average particle diameter of the Cu particles 7 is excessively large, it is unlikely to be possible to achieve an increased filling rate when the via-hole conductors 14 are formed with smaller diameters such as from 100 to 150 μm.

The purity of the Cu particles 7 is preferably 90% by mass or more, more preferably 99% by mass or more. The Cu particles 7 become softer as the copper purity thereof increases. As a result, they become more easy to deforming in a pressurization step to be described later, and therefore when a plurality of Cu particles 7 are brought into contact with one another, the Cu particles 7 are readily deformed, resulting in increased contact areas of the Cu particles 7. In addition, high purity is preferable from the viewpoint of resistance reduction of the Cu particles 7.

Note that the average particle diameter of the Cu particles 7 and the plane contact portions 20 in which the Cu particles 7 are in plane contact with one another are measured and confirmed using a scanning electron microscope (SEM) to observe a sample created by embedding a formed multilayer wiring board in resin and thereafter polishing cross sections of via-hole conductors 14 (using microfabrication means, such as focused ion beam, as necessary).

A number of Cu particles 7 are brought into contact with one another to form a joined unit 17a, thereby forming a low-resistance conduction path between the wirings 12a and 12b. By forming such a joined unit 17a, it becomes possible to reduce connection resistance between the wirings 12a and 12b.

Also, as for the via-hole conductors 14, it is preferable that the low-resistance joined units 17a be formed with a complicated network of a number of Cu particles 7 in random contact as shown in FIG. 1B, rather than in orderly arrangement. The joined units 17a each forming such a network make it possible to increase the reliability of electric connections. In addition, a number of Cu particles 7 are preferably in plane contact with one another in random positions. By setting the Cu particles 7 in plane contact with one another in random positions, it becomes possible to allow deformation to disperse stress caused within the via-hole conductors 14 when heated and externally applied force.

The volume percent of the Cu particles 7 contained in the via-hole conductors 14 is preferably 30 to 90% by volume, more preferably 40 to 70% by volume. When the volume percent of the Cu particles 7 is excessively low, the electrical connection reliability of the joined units 17a formed as conduction paths by a number of Cu particles 7 in plane contact with one another tends to decrease, and when the volume percent is excessively high, resistance values tend to cause fluctuations in a reliability test.

As shown in FIG. 1B, at least part of the second metal regions 18 mainly composed of at least one metal selected from the group consisting of tin, a tin-copper alloy, and a tin-copper intermetallic compound are formed so as to be in contact with the surfaces of the first metal regions 17. The first metal regions 17 are reinforced by forming the second metal regions 18 on the surfaces of the first metal regions 17 in such a manner. In addition, it is preferable that the second metal regions 18 at least partially cover and extend over the plane contact portions 20 in which the copper particles 7 are in plane contact with one another. The contact state of the plane contact portions 20 is further strengthened by forming the second metal regions 18 extending over the plane contact portions 20 in such a manner.

The second metal regions 18 are mainly composed of at least one metal selected from the group consisting of tin, a tin-copper alloy, and a tin-copper intermetallic compound. Concretely, for example, they are mainly composed of a metal including a simple substance of Sn, or $Cu_6Sn_5$, $Cu_3Sn$ or the like. In addition, other metal elements such as Bi and Cu may be included as the remaining components in such a range as not to ruin the effect of the present invention, concretely, in the range of, for example, 10% by mass or less.

Also, in the metal portions 15, the third metal regions 19 mainly composed of Bi are preferably in contact with the second metal regions 18 but out of contact with the Cu particles 7, as shown in FIG. 1B. In the via-hole conductors 14, the third metal regions 19 do not reduce the conductivity of the first metal regions 17 so long as the third metal regions 19 are present so as not to be in contact with the Cu particles 7.

The third metal regions 19 are mainly composed of Bi. In addition, the third metal regions 19 may include, for example, an alloy or intermetallic compound of Bi and Sn as the remaining component in such a range as not to ruin the effect of the present invention, concretely, in the range of, for example, 20% by mass or less.

Note that since the second metal regions 18 and the third metal regions 19 are in contact with each other, they normally include both Bi and Sn. In this case, the second metal regions 18 have a higher Sn concentration than the third metal regions 19, while the third metal regions 19 have a higher Bi concentration than the second metal regions 18. In addition, it is preferable that the interfaces between the second metal regions 18 and the third metal regions 19 be unclear rather than be clearly defined. When the interfaces are unclear, it is possible to inhibit stress from focusing on the interfaces even under the condition of heating for thermal shock testing or suchlike.

The metal portions 15 thus included in the via-hole conductors 14 include the first metal regions 17 made of copper particles 7, the second metal regions 18 mainly composed of at least one metal selected from the group consisting of tin, a tin-copper alloy, and a tin-copper intermetallic compound, and the third metal regions 19 mainly composed of bismuth. Note that the weight ratio of Cu to Sn (Cu/Sn) in the metal portions 15 is preferably in the range from 1.59 to 21.43. The meaning of the Cu/Sn ratio will be described in detail later.

On the other hand, the resin portions 16 included in the via-hole conductors 14 are made of a hardened material of curable resin. The curable resin is not specifically limited, but concretely, for example, hardened epoxy resin is particularly preferred in view of its superior heat resistance and low linear expansion coefficient.

The volume percent of the resin portions 16 in the via-hole conductors 14 is preferably 0.1 to 50% by volume, more preferably, 0.5 to 40% by volume. When the volume percent of the resin portions 16 is excessively high, resistance values tend to increase, and when the volume percent is excessively low, conductive paste preparation at the time of manufacture tends to be difficult.

Next, the effect of the via-hole conductors 14 in the multilayer wiring board 11 will be schematically described with reference to FIG. 2.

Figure 2:
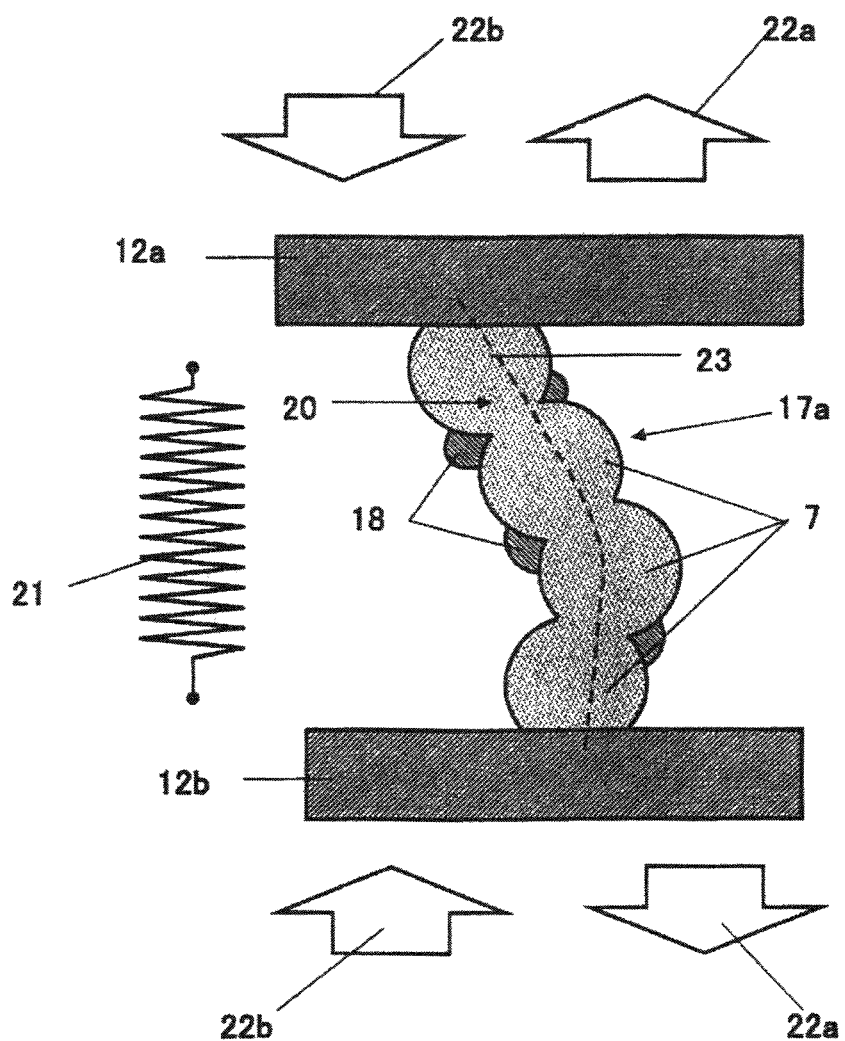
FIG. 2 is an explanatory diagram describing a copper-particle joined unit 17a in the first embodiment, which is formed by a number of Cu particles 7 in plane contact with one another and functions as a conduction path 23 between wirings 12.

FIG. 2 is an explanatory diagram for description focusing on a conduction path 23 of one joined unit 17a formed by a number of Cu particles 7 in contact with one another. Also, for the sake of convenience, elements including the resin portion 16 are not shown. Furthermore, "21" denotes a virtual spring conveniently shown for describing the effect of the via-hole conductor 14.

As shown in FIG. 2, the joined unit 17a formed by a number of Cu particles 7 in random plane contact with one another functions as the conduction path 23 for electrical interlayer connection between the wirings 12a and 12b. Note that as for the plane contact portions 20 in which the Cu particles 7 are in contact with one another, the second metal regions 18 are preferably formed so as to cover around and extend over the plane contact portions 20.

When internal stress occurs in the multilayer wiring board 11, outward force as indicated by arrows 22a is applied in the multilayer wiring board 11. Such internal stress occurs, for example, at the time of solder reflow or thermal shock testing due to the difference in thermal expansion coefficients between component materials.

Such outward force is weakened through deformation of the Cu particles 7, which are highly flexible, elastic deformation of the joined units 17a formed by the Cu particles 7 in contact with one another, or slight shift in contact positions of the Cu particles 7. At this time, since the hardness of the second metal regions 18 is greater than the hardness of the Cu particles 7, the second metal regions 18 are inclined to resist deformation of the joined units 17a, particularly, deformation of the plane contact portions 20. Accordingly, in the case where the joined units 17a keep on deforming indefinitely, the second metal regions 18 regulate the deformation to some extent, and therefore the deformation does not progress to such an extent that the plane contact portions 20 between the Cu particles 7 become out of contact. In the case where the joined units 17a formed by the Cu particles 7 in contact with one another are likened to springs, when a certain amount of force is applied to the joined units 17a, the joined units 17a keep on deforming to some extent as if the springs were expanding, and when the joined units 17a further keep on deforming, the harder second metal regions 18 regulate the deformation. A similar effect is also achieved when inward force as indicated by arrows 22b is applied to the multilayer wiring board 11. In this manner, as if the joined units 17a were the springs 21, deformation of the joined units 17a is regulated against forces in any directions whether they are external or internal, thereby ensuring the reliability of electrical connection.

Next, an exemplary method for manufacturing the multilayer wiring board 11 as described above will be described for each manufacturing step with reference to the drawings.

Figure 4A:
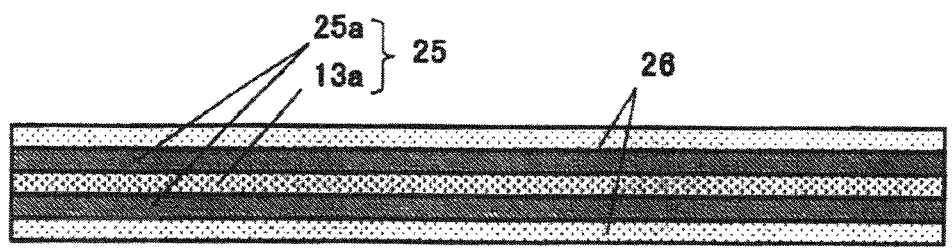
FIG. 4A illustrates a schematic cross-sectional view describing a step in a method for manufacturing a multilayer wiring board 11 in the first embodiment.

In the manufacturing method of the present embodiment, initially, protective films 26 are attached to opposite surfaces of a resin sheet 25, as shown in FIG. 4A. The resin sheet 25 used in the present embodiment is a laminate of uncured resin layers 25a put on opposite surfaces of a heat-resistant resin sheet 13a. In the case where such a resin sheet 25 is used, it is possible to obtain a thinner multilayer wiring board compared to a multilayer wiring board obtained using a prepreg, as will be described later. Concretely, an insulating resin layer with sufficient insulation properties can be formed even if its thickness is, for example, 15 µm or less or even 6 µm or less. The uncured resin layers 25a adhere metal foil and formed wirings.

Any resin sheet can be used as the heat-resistant resin sheet 13a without limitation so long as it can resist the temperature of soldering. Specific examples thereof include sheets made of, for example, polyimide, liquid crystal polymer, polyester ether ketone, or the like. Among them, the polyimide sheet is particularly preferable.

The heat-resistant resin sheet 13a has a thickness of, preferably, 1 to 100 µm, more preferably, 3 to 75 µm, particularly preferably, 7.5 to 60 µm.

The uncured resin layers 25a are, for example, uncured adhesive layers made of epoxy resin or suchlike. In addition, each of the uncured resin layers 25a has a thickness of, preferably, 1 to 30 µm, more preferably, 5 to 10 µm, in view of contribution to thickness reduction of the multilayer wiring board.

Various resin films can be used as protective films. Specific examples thereof include resin films of PET (polyethylene terephthalate), PEN (polyethylene naphthalate), or the like. Such a resin film has a thickness of, preferably, 0.5 to 50 µm, more preferably, 1 to 30 µm. In the case of such a thickness, sufficiently high protrusions made from via paste can be revealed by removing protective films, as will be described later.

One example of the method for attaching the protective films 26 to the resin sheet 25 is direct attachment taking advantage of surface tackiness of the surfaces of the uncured resin layers 25a.

Figure 4B:
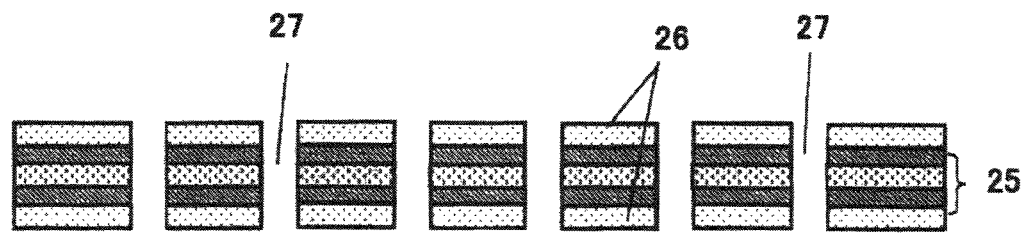
FIG. 4B illustrates a schematic cross-sectional view describing a step subsequent to the step of FIG. 4A in the method for manufacturing the multilayer wiring board 11.

Next, the resin sheet 25 with the protective films 26 disposed thereon is perforated from outside either of the protective films 26, thereby making through-holes 27, as shown in FIG. 4B. Various methods can be used for the perforation, including noncontact processing methods using a carbon dioxide gas laser, a YAG laser, or the like, and other methods using drilling or suchlike. The through-holes have a diameter of, for example, 10 to 500 µm, or even about 50 to 300 µm.

Figure 4C:
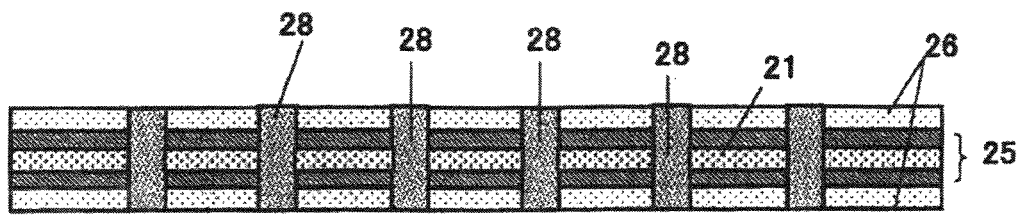
FIG. 4C illustrates a schematic cross-sectional view describing a step subsequent to the step of FIG. 4B in the method for manufacturing the multilayer wiring board 11.

Next, via paste 28 is applied to completely fill the through-holes 27, as shown in FIG. 4C. The via paste 28 contains Cu particles, Sn—Bi based solder particles containing Sn and Bi, and a curable resin component such as epoxy resin.

The average particle diameter of the Cu particles is in the range of, preferably, from 0.1 to 20 µm, more preferably, from 1 to 10 µm. In the case where the average particle diameter of the Cu particles is excessively small, a high degree of filling in the through-holes 27 tends to be difficult and also expensive. On the other hand, in the case where the average particle diameter of the Cu particles is excessively large, filling tends to be difficult when forming via-hole conductors with smaller diameters.

Also, the Cu particles are not specifically limited to any particle form. Concretely, examples of the form include spherical, flat, polygonal, scaly, flaky forms, and other forms with surface projections. Furthermore, the particles may be primary particles, or secondary particles may be formed.

The Sn—Bi based solder particles are not limited to any specific particulate solder so long as Sn and Bi are contained. The Sn—Bi based solder particles have its eutectic point changeable in the range from about 138° C. to 232° C. by changing its composition ratio or by adding various elements. Furthermore, indium (In), silver (Ag), zinc (Zn) or the like may be added to improve wettability, flowability, etc. Particularly preferable among them is, for example, Sn-58Bi solder, which is environmentally-friendly lead-free solder with a low eutectic point of 138° C.

The average particle diameter of the Sn—Bi based solder particles are in the range of, preferably, from 0.1 to more preferably, from 2 to 15 µm. An excessively small average particle diameter of the Sn—Bi based solder particles increases the specific surface area, resulting in an increased proportion of an oxide film on the surface, which leads to the tendency to be resistant to melting. On the other hand, an excessively large average particle diameter of the Sn—Bi based solder particles lead to the tendency to reduce via-hole fillability.

Specific examples for use as epoxy resin, which is a preferred curable resin component, include glycidyl ether epoxy resin, alycyclic epoxy resin, glycidyl amine epoxy resin, glycidyl ester epoxy resin, and other modified epoxy resin.

Also, a curing agent may be combined with epoxy resin. While the curing agent is not limited to any specific type, it is preferable to use a curing agent which contains an amine compound having at least one or more hydroxyl groups in its molecules. Such a curing agent is preferable in that it functions as a curing catalyst for epoxy resin, and has a function of reducing oxide films present on the surfaces of the Cu particles and the Sn—Bi based solder particles, thereby lessening contact resistance at the time of junction. Among them, the amine compound, which has a boiling point higher than the melting point of the Sn—Bi based solder particles, is particularly preferable in that it is particularly highly effective in lessening the contact resistance at the time of junction.

Specific examples of such an amine compound include 2-methylaminoethanol (boiling point: 160° C.), N,N-diethyl ethanolamine (boiling point: 162° C.), N,N-dibutylethanolamine (boiling point: 229° C.), N-methylethanolamine (boiling point: 160° C.), N-methyldiethanolamine (boiling point: 247° C.), N-ethylethanolamine (boiling point: 169° C.), N-butylethanolamine (boiling point: 195° C.), diisopropanolamine (boiling point: 249° C.), N,N-diethylisopropanolamine (boiling point: 125.8° C.), 2,2'-dimethylaminoethanol (boiling point: 135° C.), and triethanolamine (boiling point: 208° C.).

The via paste is prepared by mixing Cu particles, Sn—Bi based solder particles, which contains Sn and Bi, and a curable resin component such as epoxy resin. Concretely, the preparation is performed by, for example, adding Cu particles and Sn—Bi based solder particles to resin varnish which contains epoxy resin, a curing agent, and a predetermined amount of organic solvent, and mixing them by a planetary mixer or suchlike.

The blending ratio of the curable resin component to a total amount, including a metal component which includes the Cu particles and the Sn—Bi based solder particles, is in the range of, preferably from 0.3 to 30% by mass, more preferably, from 3 to 20% by mass, from the viewpoint of achieving low resistance and ensuring sufficient workability.

Also, the metal component preferably contains Cu particles at such a content ratio as to accord with the weight ratio of Cu and Sn (Cu/Sn) in the range of from 1.59 to 21.43. The reason for this will be described in detail later. Accordingly, for example, when Sn-58Bi solder particles are used as the Sn—Bi based solder particles, the content ratio of Cu particles is preferably 40 to 90% by mass, more preferably, 55.8 to 65.5% by mass, of a total amount of the Cu particles and the Sn-58Bi solder particles.

The via paste filling method is not specifically limited. Concretely, for example, a method for use in screen printing or suchlike is used. Note that in the manufacturing method of the present embodiment, when filling in through-holes with via paste, it is necessary to fill the through-holes 27 provided in the resin sheet 25 in such an amount that the paste is overflowing from the through-holes 27, so that the via paste 28 partially protrudes from the through-holes 27 provided in the resin sheet 25 and protrusions are revealed when the protective films 26 are removed after the filling step.

Figure 4D:
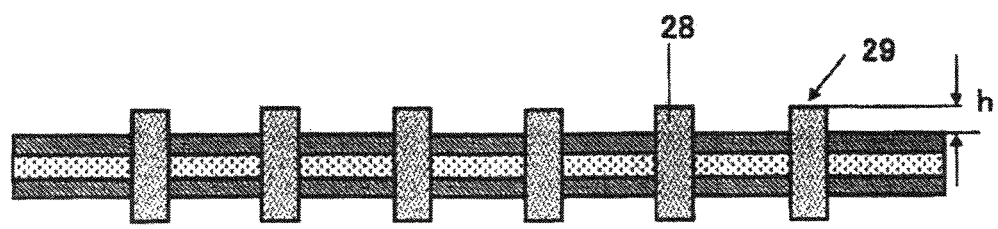
FIG. 4D illustrates a schematic cross-sectional view describing a step subsequent to the step of FIG. 4C in the method for manufacturing the multilayer wiring board 11.

Next, the protective films 26 are removed from the surfaces of the resin sheet 25, so that the via paste 28 partially projects from the through-holes 27 to form protrusions 29, as shown in FIG. 4D. Although depending on the thickness of the protective films, the height h of the protrusions 29 is preferably, for example, 0.5 to 50 μm, more preferably, 1 to 30 μl. When the height of the protrusions 29 is excessively high, the paste might be caused to flow over the through-holes 27 in the surfaces of the resin sheet 25 in a compression-bonding step to be described later, resulting in impaired surface smoothness, which is not preferable, and when the height is excessively low, there is a tendency for sufficient pressure not to be exerted on the applied via paste in the compression-bonding step to be described later.

Figure 5A:
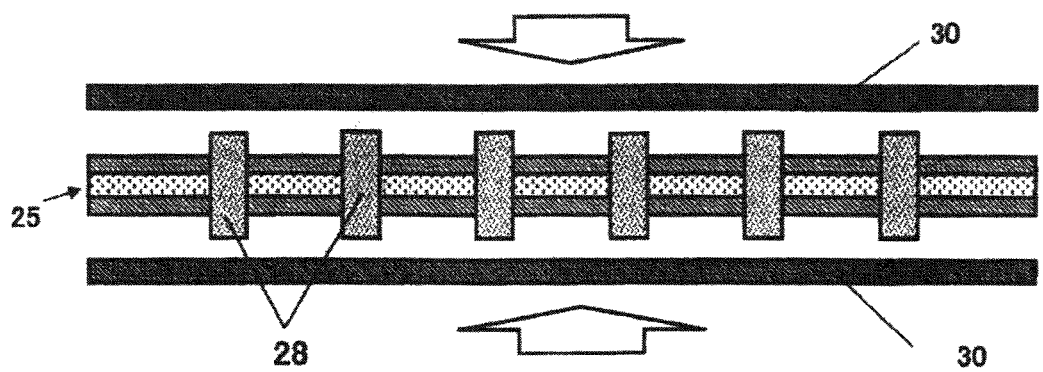
FIG. 5A illustrates a schematic cross-sectional view describing a step subsequent to the step of FIG. 4D in the method for manufacturing the multilayer wiring board 11.
Figure 5B:
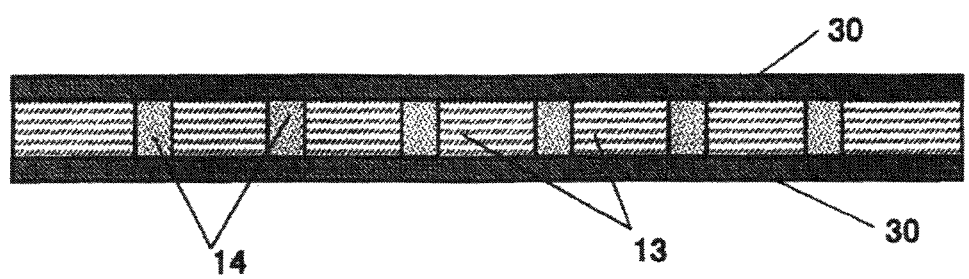
FIG. 5B illustrates a schematic cross-sectional view describing a step subsequent to the step of FIG. 5A in the method for manufacturing the multilayer wiring board 11.

Next, sheets of copper foil 30 are placed on the resin sheet 25 and pressed in directions indicated by arrows, as shown in FIG. 5A. As a result, the resin sheet 25 and the sheets of copper foil 30 are integrated, forming an insulating resin layer 13, as shown in FIG. 5B. In this case, force is applied to the protrusions 29 via the sheets of copper foil 30 at the beginning of pressing, so that the via paste 28 applied in the through-holes 27 are compressed under high pressure. As a result, gaps between the Cu particles 7 included in the via paste 28 are narrowed, so that the Cu particles 7 are deformed in plane contact with one another.

The pressing condition is not specifically limited but a preferred condition is such that the die temperature is set within the range from room temperature (20° C.) to less than the melting point of the Sn—Bi based solder particles. Also, to promote curing of the uncured resin layers 25a, this pressing step may use a hot press heated to a temperature necessary to promote the curing.

The compression of the via paste 28 with the protrusions 29 will now be described in detail with reference to FIGS. 7A and 7B.

Figure 7A:
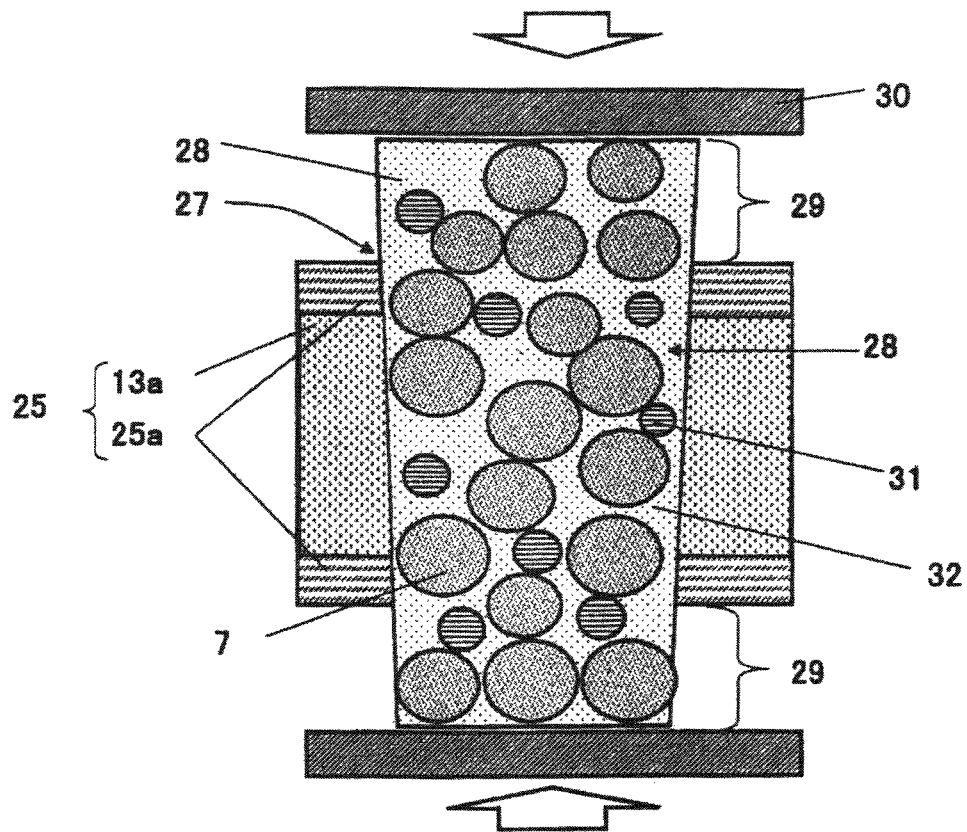
FIG. 7A is a schematic cross-sectional view illustrating a portion around one through-hole 27 in a resin sheet 25, which is filled with via paste 28, in the first embodiment.
Figure 7B:
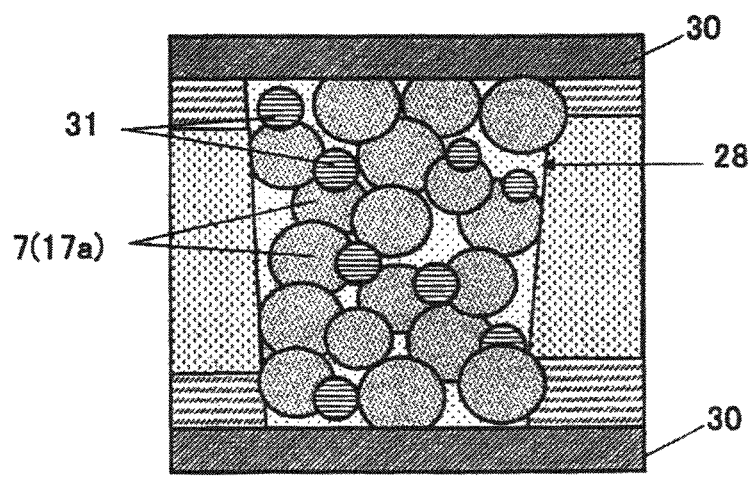
FIG. 7B is a schematic cross-sectional view illustrating a state where the via paste 28 applied in the through-hole 27 of FIG. 7A is compressed in the embodiment.

FIG. 7A is a schematic cross-sectional view of pre-compression, including a portion around one through-hole 27 in the resin sheet 25, which is filled with the via paste 28, and FIG. 7B is a schematic cross-sectional view of post-compression.

The protrusions 29 projecting from the through-hole 27 provided in the resin sheet 25 are pressed via the sheets of copper foil 30, as shown in FIG. 7A, so that the via paste 28 applied in the through-hole 27 is compressed, as shown in FIG. 7B. In some cases, pressure application for the compression might push part of a curable resin component 32 out onto the surfaces of the resin sheet 25. Consequently, Cu particles 7 and Sn—Bi based solder particles 31, which are applied in the through-hole 27, increase in density.

Such highly dense Cu particles 7 contact one another. At the beginning of the compression, the Cu particles 7 are brought into point contact with one another, and then deformed as the pressure increases, so that they are deformed in plane contact with one another, thereby forming plane contact portions. In this manner, a number of Cu particles 7 are brought into plane contact with one another, forming a joined unit 17a for electrically connecting an upper-layer wiring to a lower-layer wiring with low resistance.

Note that in the present step, joined units 17a are formed such that the copper particles 7 in the via paste 28 are in contact with one another via the plane contact portions 20. The joined units 17a include the plane contact portions 20 in which the Cu particles 7 are in direct plane contact with one another without their entire surfaces being covered by the Sn—Bi based solder particles 31. Accordingly, via-hole conductors 14 to be formed are reduced in electrical resistance. As will be described later, by melting the Sn—Bi based solder particles 31 after forming the joined units 17a, the surfaces of the joined units 17a can be wetted with the molten Sn—Bi based solder. As a result, second metal regions 18 can be formed on the joined units 17a, preferably, so as to extend over the plane contact portions 20. The second metal regions 18 covering the surfaces of the joined units 17a provide the joined units 17a with flexibility. In this manner, by heating the Sn—Bi based solder particles to its melting point or higher for melting after forming the joined units 17a, the second metal regions 18 are formed in contact with at least part of the surfaces of the joined units 17a, along with third metal regions 19 in contact with the second metal regions.

After the formation of the joined units 17a by compression, the via paste 28 is heated to a temperature greater than or equal to the melting point of the Sn—Bi based solder particles 31. The heating melts the Sn—Bi based solder particles 31. Also, the second metal regions 18 are formed on and around the Cu particles 7 and the joined units 17a. In this case, it is preferable that the second metal regions 18 cover and extend over the plane contact portions 20 in which the Cu particles 7 are in plane contact with one another. The contact between the Cu particles 7 and the molten Sn—Bi based solder particles 31 results in reaction of Cu in the Cu particles 7 with Sn in the Sn—Bi based solder particles 31, thereby forming the second metal regions 18 mainly composed of an intermetallic compound which includes $Cu_6Sn_5$ or $Cu_3Sn$, or a tin-copper alloy. On the other hand, Bi still remaining in the Sn—Bi based solder particles 31 is precipitated independently of Sn, thereby forming the third metal regions 19 mainly composed of Bi.

Well-known solder materials that are molten in a relatively low-temperature range are, for example, Sn—Pb solder, Sn—In solder, and Sn—Bi solder. Among these materials, In is expensive, and Pb is considered to have high environmental impact.

Also, the melting point of the Sn—Bi based solder is less than or equal to 140° C., which is lower than a general solder reflow temperature for surface mounting of electronic components. Accordingly, in the case where the Sn—Bi based solder is used alone for via-hole conductors of a circuit board, the solder in the via-hole conductors might be remelted at the time of solder reflow, resulting in varied via resistance. On the other hand, in the case where the via paste of the present embodiment is used, Sn in the Sn—Bi based solder particles reacts with the surfaces of the Cu particles, resulting in reduced Sn concentration in the Sn—Bi based solder particles, and furthermore, a heating and cooling step causes Bi precipitation, resulting in a Bi phase. In addition, such precipitation and presence of the Bi phase makes it difficult for the via-hole conductor solder to be remelted even if it is subjected to solder reflow. As a result, even after solder reflow, varied resistance is unlikely to occur.

The temperature at which to heat the compressed via paste 28 is not specifically limited so long as it is greater than or equal to the melting point of the Sn—Bi based solder particles 31 within such a range as not to resolve the components of the resin sheet 25. Concretely, for example, in the case where Sn-58Bi solder particles are used as Sn—Bi based solder particles, the temperature is preferably in the range from approximately 150 to 250° C., more preferably, from approximately 160 to 230° C. Note that in this case, appropriate temperature selection makes it possible to harden a curable resin component included in the via paste 28.

In this manner, via-hole conductors 14 are formed for interlayer connection of upper- and lower-layer wirings.

In the present embodiment, the metal component included in the via paste 28 preferably includes Cu particles at such a content ratio as to accord with the weight ratio of Cu and Sn (Cu/Sn) in the range of from 1.59 to 21.43. The reason for this will be described below.

Figure 3:
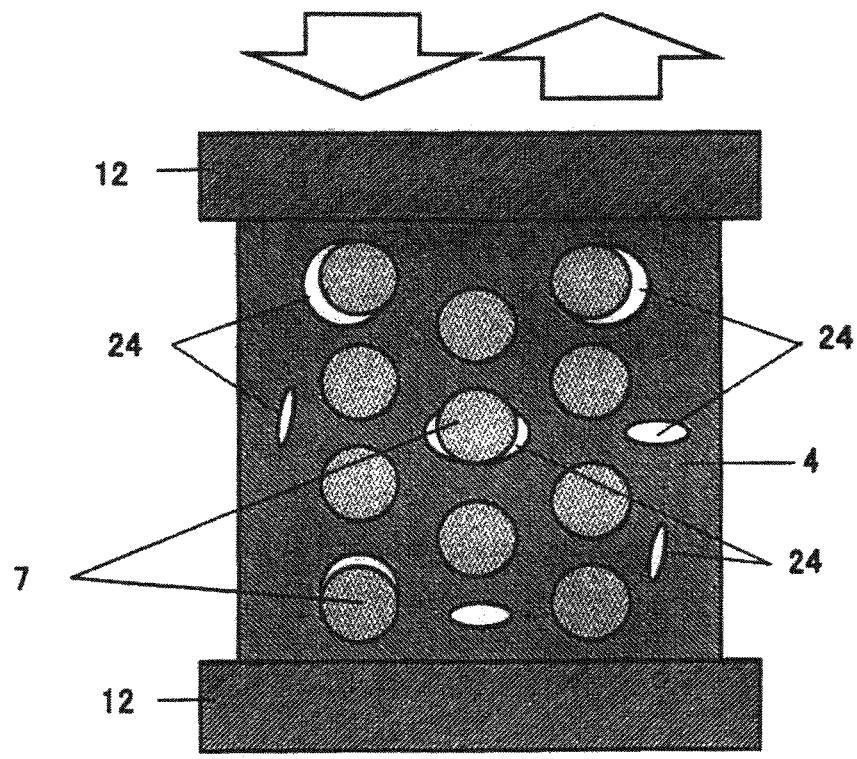
FIG. 3 is a schematic cross-sectional view describing a via-hole conductor where Cu/Sn is less than 1.59.

FIG. 3 is a schematic cross-sectional view illustrating an exemplary via-hole conductor where Cu/Sn is less than 1.59.

As shown in FIG. 3, when the ratio Cu/Sn is less than 1.59, the proportion of Cu in the via-hole conductor is small, which makes it difficult for a number of Cu particles 7 to be in plane contact with one another, so that the Cu particles 7 tend to be dotted within a matrix made of the intermetallic compound 4. In this case, the Cu particles 7 are tightly bound by the hard intermetallic compound 4, and therefore the via-hole conductors themselves tend to be in a hardened state with low springiness. When compared to the Cu particles 7, the intermetallic compound 4, such as $Cu_6Sn_5$ or $Cu_3Sn$, is hard and resistant to deformation. According to the study of the inventors, the Vickers hardness of $Cu_6Sn_5$ and $Cu_3Sn$ is about 378 $Kg/mm^2$ and about 343 $Kg/mm^2$, respectively, which are significantly higher than 117 $Kg/mm^2$ for Cu.

Furthermore, the Cu particles 7 and the intermetallic compound 4 have their respective different thermal expansion coefficients and therefore internal stress occurs at the time of solder reflow due to the difference in the thermal expansion coefficient, so that cracks and voids 24 tend to occur.

Also, when the weight ratio Cu/Sn is less than 1.59, voids tend to occur. A major factor in such occurrence of voids is contact diffusion of Sn and Cu, as typified by Kirkendall voids caused by the Kirkendall effect. Kirkendall voids tend to occur at interfaces between Cu-particle surfaces and Sn or an alloy including such Sn applied to fill gaps in the Cu particles.

When there are cracks and voids 24 at interfaces between the Cu particles 7 and the intermetallic compound 4, as shown in FIG. 3, the cracks and voids 24 tend to propagate and widen. Kirkendall voids, if they occur, tend to propagate and widen as well. In particular, when the via-hole conductors are small in diameter, the cracks and voids 24 are apt to cause cohesive failure of the intermetallic compounds 4 and furthermore wire breakage to the via-hole conductors. As a result, when such cohesive failure or interfacial failure occurs inside the via-hole conductors, electrical resistance increases in their via portions, adversely affecting the reliability of the via portions.

Now, the case where the ratio Cu/Sn is greater than or equal to 1.59 will be schematically described with reference to FIGS. 1B and 2.

When the ratio Cu/Sn is greater than or equal to 1.59, the second metal regions 18 included in the metal portions 15 physically protect the plane contact portions 20, in which a number of Cu particles 7 are in plane contact with one another, and the surfaces of the Cu particles 7 as well, as shown in FIG. 1B. The arrows 22a and 22b shown in FIG. 2 indicate external force applied to the via-hole conductor 14 and internal stress generated in the via-hole conductor 14. When external force as indicated by the arrows 22a or the internal stress 22b occurs to the via-hole conductor 14, the flexible Cu particles 7 are deformed to relax the force. In addition, even if the second metal regions 18 are cracked, since a number of Cu particles 7 are in plane contact with one another, sufficient conduction paths are maintained in the joined units 17a, so that electrical characteristics and reliability are not significantly affected. Note that the entire metal portions 15 are resiliently protected by the resin portions 16, as shown in FIG. 1B, and therefore deformation is further suppressed to a certain extent. Thus, it is unlikely that cohesive failure or interfacial failure occurs.

Also, when Cu/Sn is greater than or equal to 1.59, the second metal regions 18 tend to be formed so as to extend over the plane contact portions 20. Moreover, when Cu/Sn is greater than or equal to 1.59, Kirkendall voids are more likely to occur on the second metal region 18 side, rather than in the surface of or at the interfaces of the Sn—Bi based solder particles filled in the gaps between the Cu particles. Kirkendall voids, when generated in the second metal regions 18, are unlikely to affect the reliability and electrical characteristics of the via-hole conductors 14. This is because sufficient electrical continuity is maintained by the Cu particles 7 contacting one another.

Figure 5C:
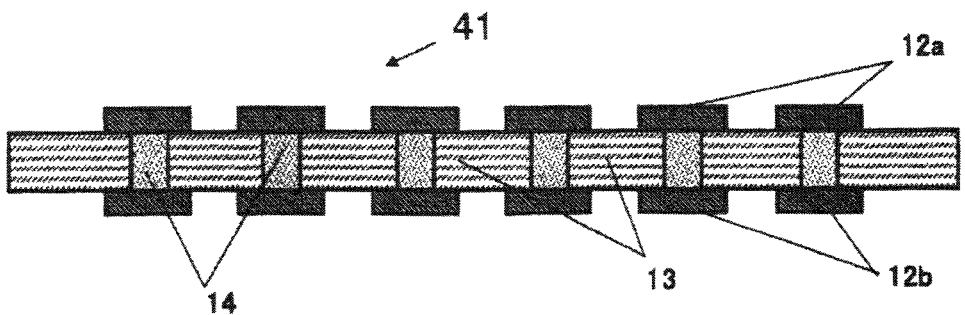
FIG. 5C illustrates a schematic cross-sectional view describing a step subsequent to the step of FIG. 5B in the method for manufacturing the multilayer wiring board 11.

Next, wiring 12 are formed as shown in FIG. 5C. The wiring 12 are formed, for example, by forming a photoresist film on the surface of the sheet of copper foil 30 affixed to the surface layer, developing the film after patterning them by selective exposure through photomask, selectively removing the copper foil by etching except for a wiring portion, and thereafter removing the photoresist film. For the formation of the photoresist film, liquid resists or dry films may be used.

Such a step results in a wiring board 41 with circuits formed on its opposite surfaces, in which the upper-layer wiring 12a and the lower-layer wiring 12b are in interlayer connection via the via-hole conductors 14. By further multilayering of such a wiring board 41, a multilayer wiring board 11, in which circuits in multiple layers are in interlayer connection, is obtained as shown in FIG. 1A. The method for multilayering of the wiring board 41 will be described with reference to FIGS. 6A to 6C.

Figure 6A:
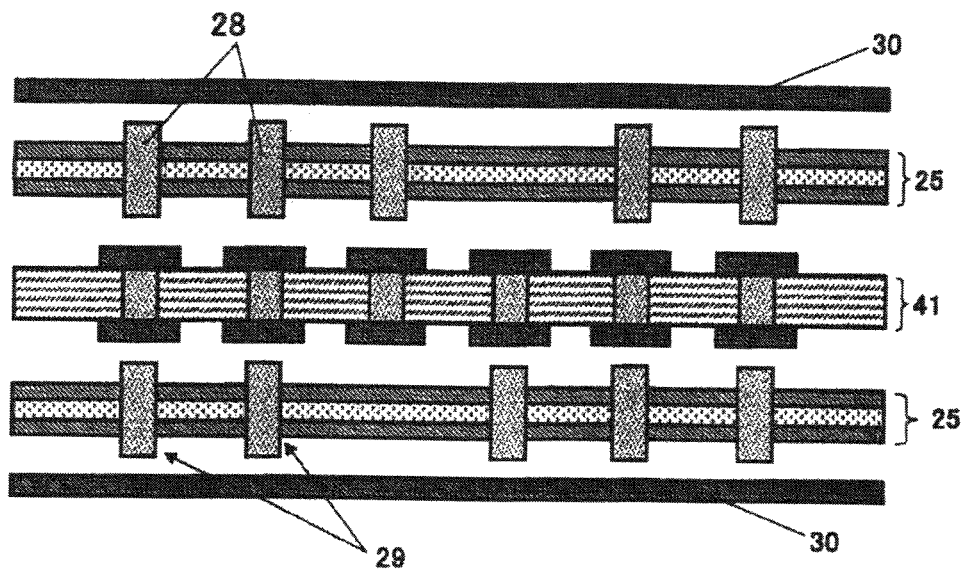
FIG. 6A illustrates a schematic cross-sectional view describing a step in multilayering of a wiring board.
Figure 6B:
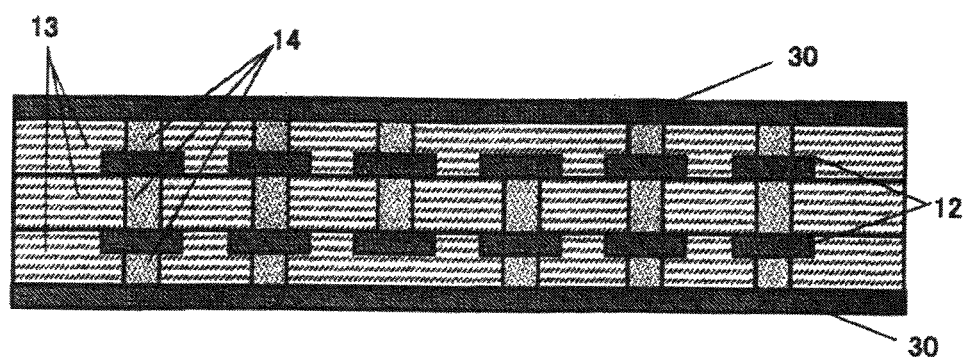
FIG. 6B illustrates a schematic cross-sectional view describing a step subsequent to the step of FIG. 6A in multilayering of the wiring board.
Figure 6C:
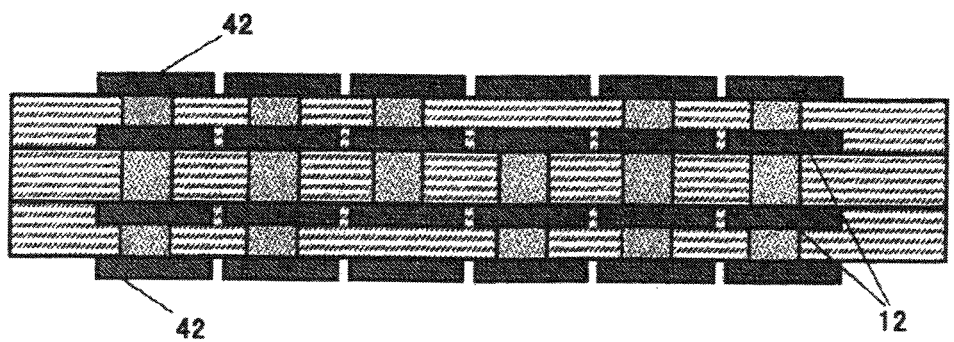
FIG. 6C illustrates a schematic cross-sectional view describing a step subsequent to the step of FIG. 6B in multilayering of the wiring board.

Initially, as shown in FIG. 6A, resin sheets 25 with protrusions 29 made of via paste 28 similar to that obtained in FIG. 4D are placed on the opposite surfaces of the wiring board 41 obtained as described above. Then, a sheet of copper foil 30 is placed on the outer surface of each resin sheet 25, thereby forming a stacked structure. Next, the stacked structure is sandwiched in a pressing die and then pressed and heated under the aforementioned conditions, resulting in a laminate as shown in FIG. 6B. Thereafter, new wirings 42 are formed by photo processing as described above. Such a multilayering process is further repeated, resulting in a multilayer wiring board 11.

Second Embodiment

A second embodiment will be described with respect to an example using a so-called, uncured or semi-cured (B-stage) prepreg 125, which is obtained by drying a fiber sheet impregnated with resin varnish, rather than the resin sheet 25, in the manufacture of the multilayer wiring board 11 in the first embodiment. Note that there is no difference from the first embodiment, except that the prepreg 125 is used in place of the resin sheet 25, and therefore common parts are denoted by the same characters. Also, detailed descriptions are omitted for any similarities to the first embodiment.

Figure 8A:
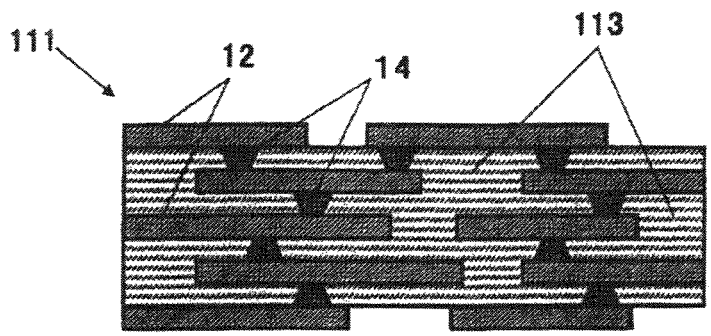
FIG. 8A is a schematic cross-sectional view of a multilayer wiring board 111 in a second embodiment.
Figure 8B:
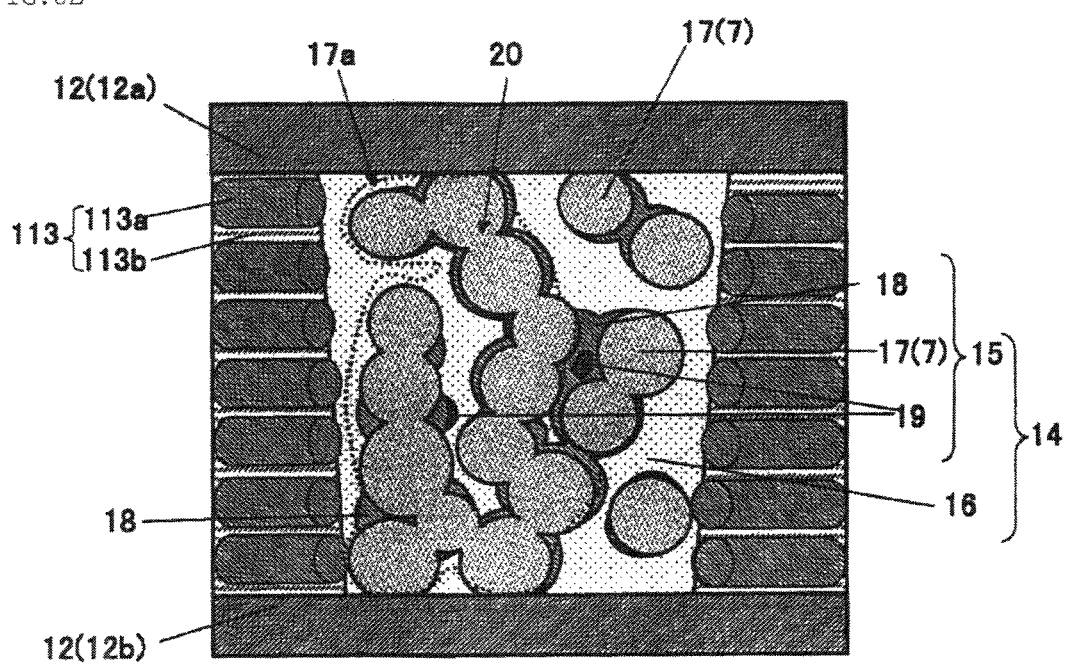
FIG. 8B is an enlarged schematic cross-sectional view around one via-hole conductor 14 in FIG. 8A.

FIG. 8A is a schematic cross-sectional view of a multilayer wiring board 111 in the present embodiment. Also, FIG. 8B is an enlarged schematic cross-sectional view around one via-hole conductor 14 in the multilayer wiring board 111 of FIG. 8A. In FIGS. 8A and 8B, "12 (12a, 12b)" denotes wirings, "113" denotes insulating resin layers, and "14" denotes via-hole conductors. The via-hole conductors 14 each include a metal portion 15 and a resin portion 16. The insulating resin layers 113 are each made of a fiber-containing resin sheet with a fiber sheet 113a impregnated with curable resin 113b. The metal portion 15 includes first metal regions 17 formed of Cu particles 7, second metal regions 18 mainly composed of at least one metal selected from the group consisting of tin, a tin-copper alloy, and a tin-copper intermetallic compound, and third metal regions 19 mainly composed of Bi. At least part of the Cu particles 7 is in plane contact with one another, forming a joined unit 17a of copper particles, as included in a portion denoted by broken lines. As such, the joined unit 17a functions as a low-resistance conduction path for electrically connecting the upper-layer wiring 12a and the lower-layer wiring 12b.

Next, an example of the method for manufacturing the aforementioned multilayer wiring board 111 will be described with reference to the drawings.

Figure 9A:
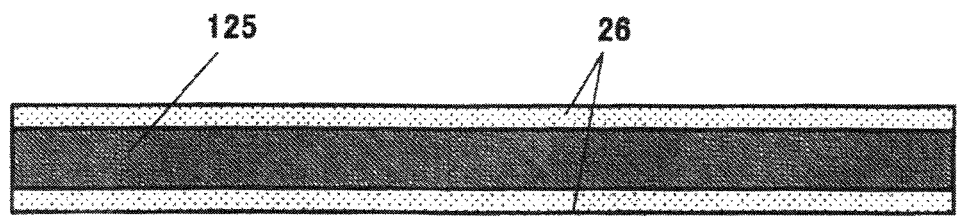
FIG. 9A illustrates a schematic cross-sectional view describing a step in a method for manufacturing a multilayer wiring board 111 in the second embodiment.

In the manufacturing method of the present embodiment, initially, protective films 26 are attached to opposite surfaces of an uncured or semi-cured (B-stage) prepreg 125, as shown in FIG. 9A.

Preferably used as the prepreg 125 is, for example, a so-called, uncured or semi-cured (B-stage) prepreg obtained by drying a fiber substrate impregnated with thermally curable resin varnish. The fiber substrate may be woven or nonwoven cloth. Specific examples thereof include glass fiber cloth such as glass cloth, glass paper, and glass mat, and also include Kraft paper, linter paper, natural fiber cloth, and organic fiber cloth made of aramid fiber. Also, an example of the resin component contained in the resin varnish is epoxy resin. Also, the resin varnish may further include an inorganic filler or suchlike.

The protective films 26 are similar to those described in the first embodiment. If the prepreg 125 has tacky surfaces, using such tackiness is an example of the method for attaching the protective films 26 to the prepreg 125.

Figure 9B:
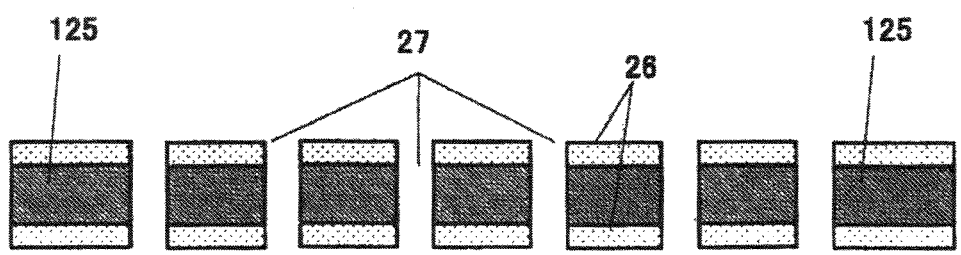
FIG. 9B illustrates a schematic cross-sectional view describing a step subsequent to the step of FIG. 9A in the method for manufacturing the multilayer wiring board 111.

Next, the prepreg 125 with the protective films 26 disposed thereon is perforated from outside either of the protective films 26, thereby making through-holes 27, as shown in FIG. 9B. Various methods can be used for the perforation, including noncontact processing methods using a carbon dioxide gas laser, a YAG laser, or the like, and other methods using drilling or suchlike. The through-holes have a diameter of, for example, 10 to 500 μm, or even about 50 to 300 μm.

Figure 9C:
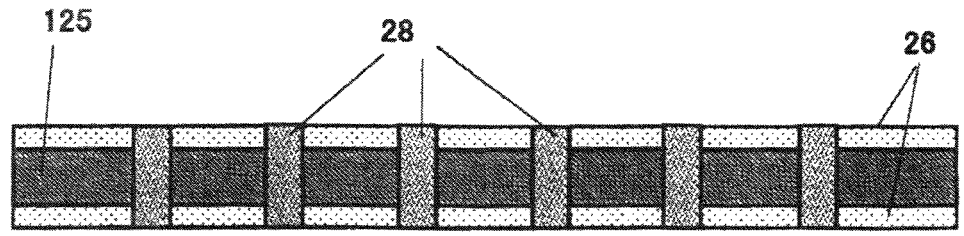
FIG. 9C illustrates a schematic cross-sectional view describing a step subsequent to the step of FIG. 9B in the method for manufacturing the multilayer wiring board 111.

Next, via paste 28 is applied to completely fill the through-holes 27, as shown in FIG. 9C. The via paste 28 contains Cu particles, Sn—Bi based solder particles containing Sn and Bi, and a curable resin component such as epoxy resin. Note that the via paste 28 is similar to that described in the first embodiment.

Figure 9D:
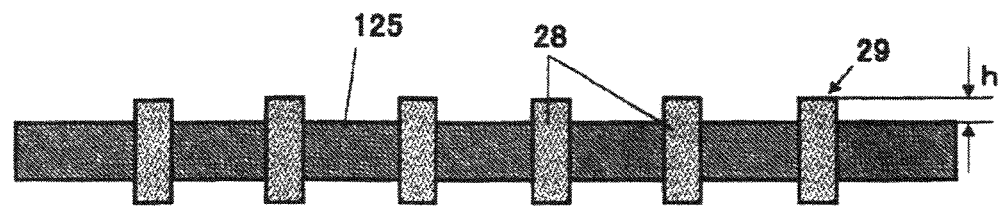
FIG. 9D illustrates a schematic cross-sectional view describing a step subsequent to the step of FIG. 9C in the method for manufacturing the multilayer wiring board 111.

Next, the protective films 26 are removed from the surfaces of the prepreg 125, so that the via paste 28 partially projects from the through-holes 27 provided in the prepreg 125 to form protrusions 29, as shown in FIG. 9D. Although depending on the thickness of the protective film, the height h of the protrusion 29 is preferably, for example, 0.5 to 50 μm, more preferably, 1 to 30 μm. When the height of the protrusion is excessively high, the paste might be caused to flow over the through-hole 27 in the surface of the prepreg 125 in a compression-bonding step to be described later, resulting in impaired surface smoothness, which is not preferable, and when the height is excessively low, there is a tendency for sufficient pressure not to be exerted on the applied via paste in the compression-bonding step to be described later.

Figure 10A:
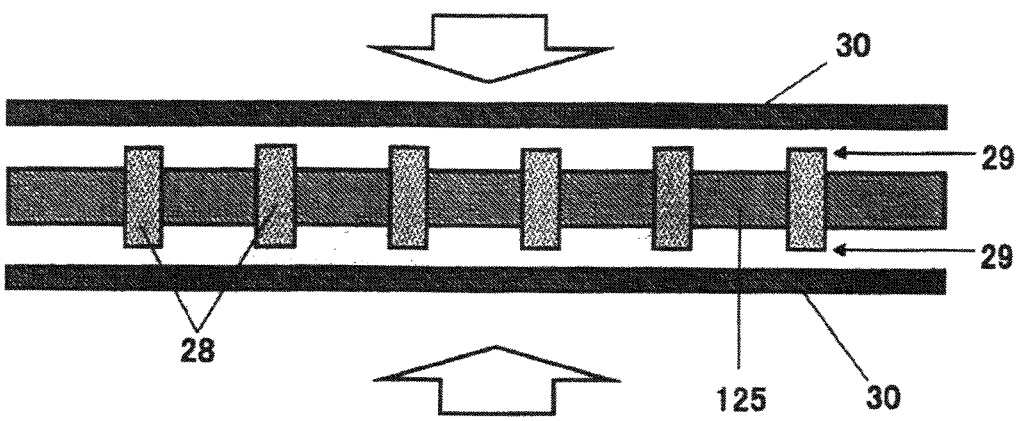
FIG. 10A illustrates a schematic cross-sectional view describing a step subsequent to the step of FIG. 9D in the method for manufacturing the multilayer wiring board 111.
Figure 10B:
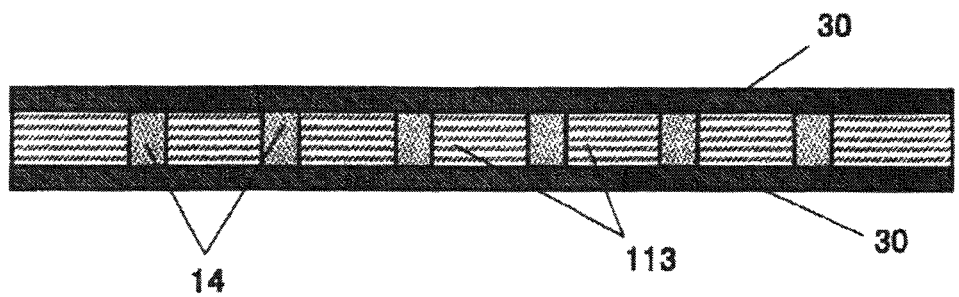
FIG. 10B illustrates a schematic cross-sectional view describing a step subsequent to the step of FIG. 10A in the method for manufacturing the multilayer wiring board 111.

Next, sheets of copper foil 30 are placed on the opposite surfaces of the prepreg 125 and pressed in directions indicated by arrows, as shown in FIG. 10A. As a result, the prepreg 125 and the sheets of copper foil 30 are integrated, forming an insulating resin layer 113, as shown in FIG. 10B. In this case, force is applied to the protrusions 29 via the sheets of copper foil 30 at the beginning of pressing, so that the via paste 28 filled in the through-holes is compressed under high pressure. As a result, gaps between the Cu particles 7 included in the via paste 28 are narrowed, so that the Cu particles 7 are deformed in plane contact with one another.

The pressing condition is not specifically limited but a preferred condition is such that the die temperature is set within the range from room temperature (20° C.) to less than the melting point of the Sn—Bi based solder particles.

The compression of the via paste 28 with the protrusions 29 applied in the through-holes of the prepreg 125 will now be described in detail with reference to FIGS. 12A and 12B.

Figure 12A:
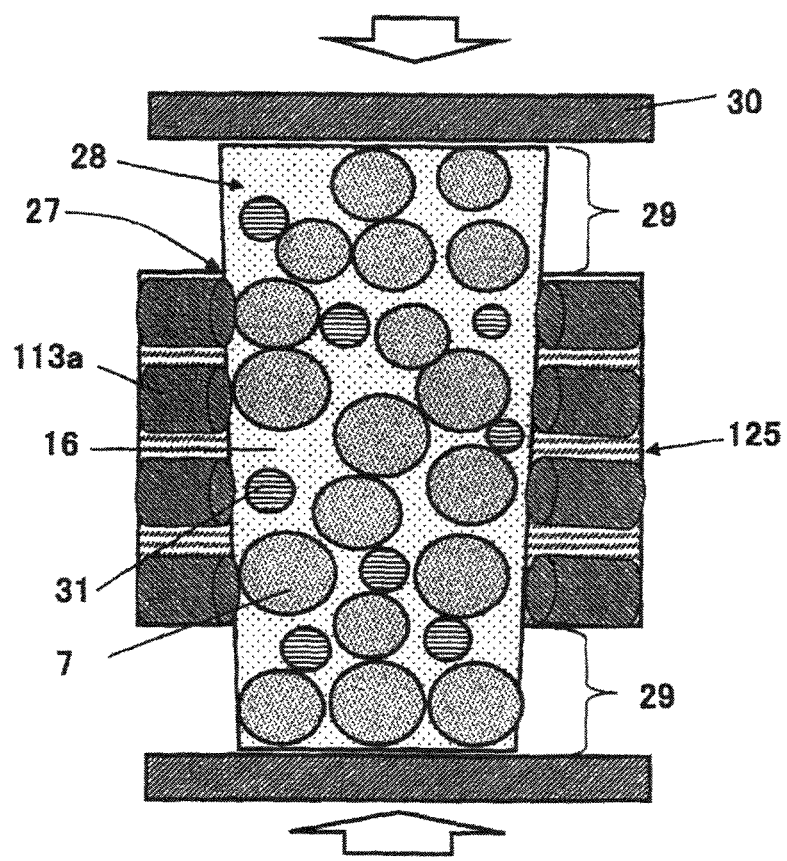
FIG. 12A is a schematic cross-sectional view illustrating a portion around one through-hole 27 in a prepreg 125, which is filled with via paste 28 in the second embodiment.
Figure 12B:
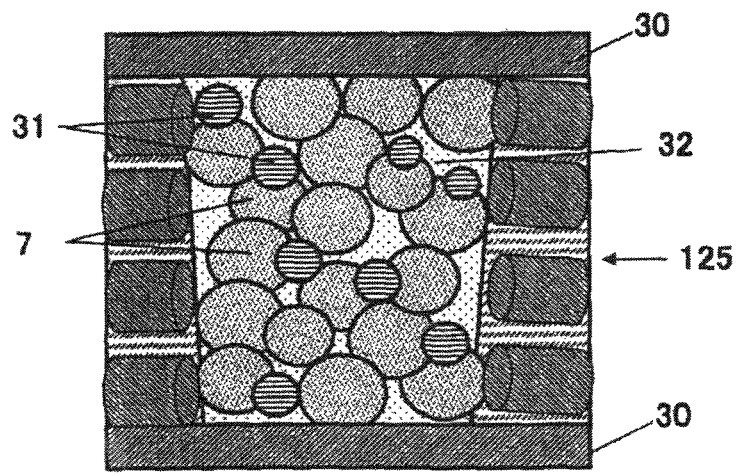
FIG. 12B is a schematic cross-sectional view illustrating a state where the via paste 28 applied in the through-hole of FIG. 12A is compressed in the second embodiment.

FIG. 12A is a schematic cross-sectional view of pre-compression, including a portion around one through-hole 27 in the prepreg 125, which is filled with the via paste 28, and FIG. 12B is a schematic cross-sectional view of post-compression. A fiber substrate included in the prepreg 125 is shown at 113a.

The protrusions 29 projecting from the through-hole 27 provided in the prepreg 125 are pressed via the sheets of copper foil 30, as shown in FIG. 12A, so that the via paste 28 applied in the through-hole 27 is compressed, as shown in FIG. 12B. Pressure application for the compression causes a curable resin component 32 to partially permeate through the prepreg 125. Consequently, Cu particles 7 and Sn—Bi based solder particles 31, which are applied in the through-hole 27, increase in density.

Such highly dense Cu particles 7 contact one another. At the beginning of the compression, the Cu particles 7 are brought into point contact with one another, and then deformed as the pressure increases, so that they are deformed in plane contact with one another, thereby forming plane contact portions. In this manner, a number of Cu particles 7 are brought into plane contact with one another, thereby forming a joined unit for electrically connecting an upper-layer wiring to a lower-layer wiring with low resistance. As a result, via-hole conductors 14 are formed for interlayer connection between the upper- and lower-layer wirings.

Figure 10C:
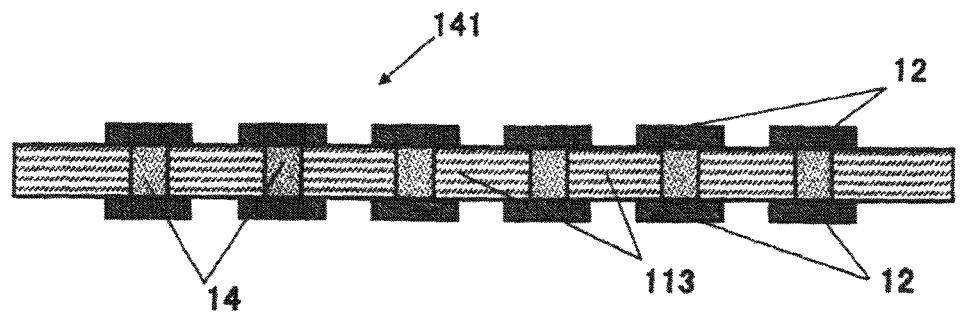
FIG. 10C illustrates a schematic cross-sectional view describing a step subsequent to the step of FIG. 10B in the method for manufacturing the multilayer wiring board 111.

Next, wirings 12 are formed as shown in FIG. 10C. The wiring 2 are formed, for example, by forming photoresist film on the surface of the sheet of copper foil 30 affixed to the surface layer, developing the film after patterning them by selective exposure through photomask, selectively removing the copper foil by etching except for wiring portion, and thereafter removing the photoresist film. For the formation of the photoresist film, liquid resists or dry films may be used.

Such a step results in a wiring board 141 with circuits formed on its opposite surfaces, in which the upper-layer wiring 12a and the lower-layer wiring 12b are in interlayer connection via the via-hole conductor 14. By further multilayering of such a wiring board 141, a multilayer wiring board 111, in which circuits in multiple layers are in interlayer connection, is obtained. The method for further multilayering of the wiring board 141 will be described with reference to FIGS. 11A to 11C.

Figure 11A:
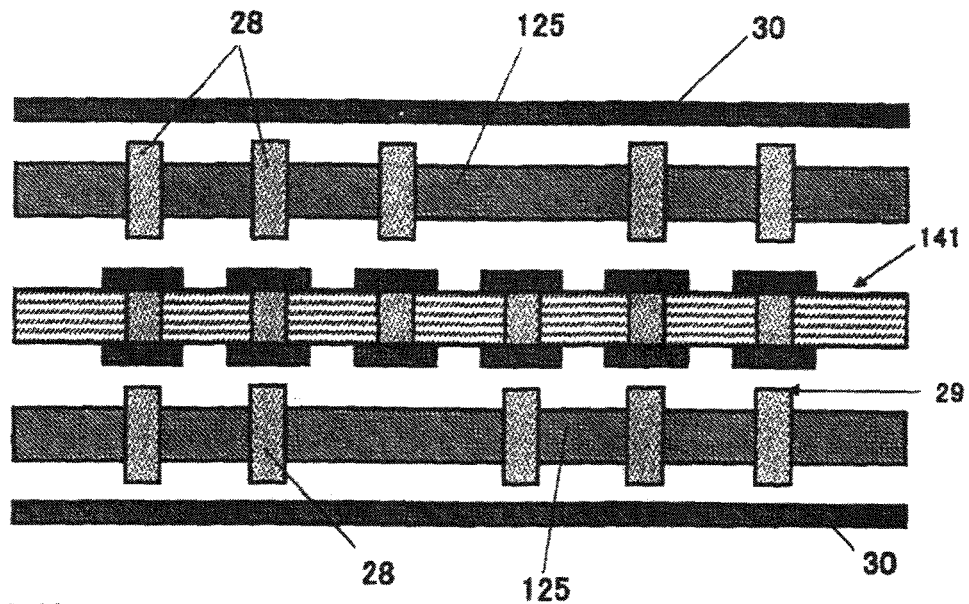
FIG. 11A illustrates a schematic cross-sectional view describing a step in multilayering of a wiring board.
Figure 11B:
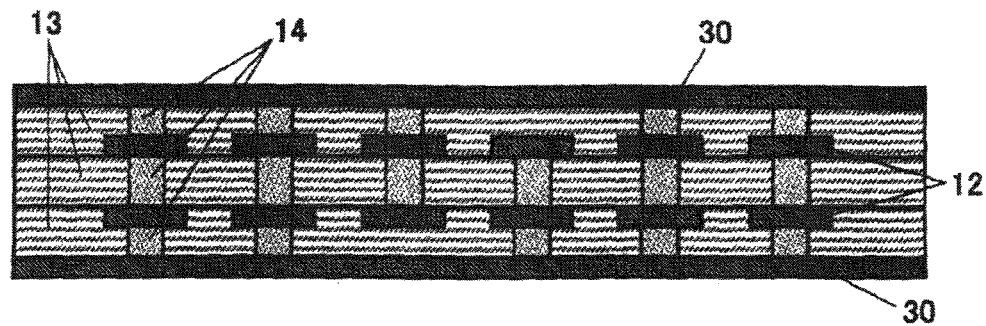
FIG. 11B illustrates a schematic cross-sectional view describing a step subsequent to the step of FIG. 11A in multilayering of the wiring board.
Figure 11C:
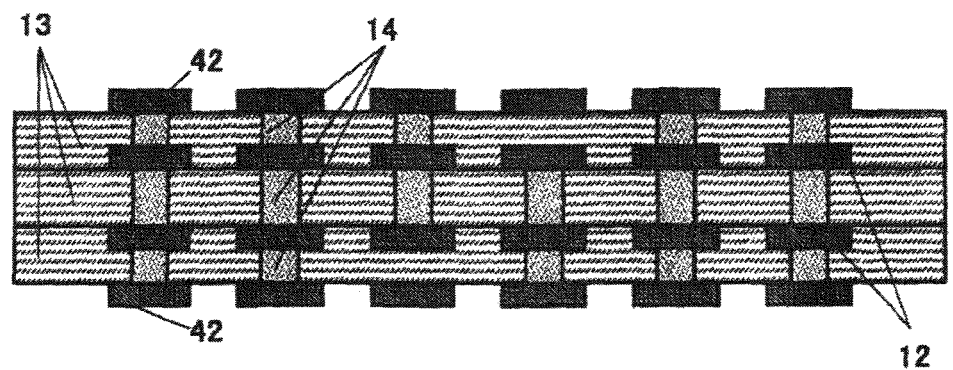
FIG. 11C illustrates a schematic cross-sectional view describing a step subsequent to the step of FIG. 11B in multilayering of the wiring board.

Initially, as shown in FIG. 11A, prepregs 125 with protrusions 29 made of via paste 28 similar to that obtained in FIG. 9D are placed on the opposite surfaces of the wiring board 141 obtained as described above. Then, a sheet of copper foil 30 is placed on the outer surface of each prepreg 125, thereby forming a stacked structure. Next, the stacked structure is sandwiched in a pressing die and then pressed and heated under the aforementioned conditions, resulting in a laminate as shown in FIG. 11B. Thereafter, new wirings 42 are formed by photo processing as described above. Such a multilayering process is further repeated, resulting in a multilayer wiring board 111.

Next, the present invention will be described more specifically by way of example. Note that the contents of the example are not to be in any way construed as limiting the scope of the present invention.

Example

First, raw materials used in the present example are described together below.

Cu particles: 1100Y manufactured by Mitsui Mining & Smelting Co., Ltd. with an average particle diameter of 5 μm, Sn—Bi based solder particles: Sn42-Bi58 with an average particle diameter of 5 μm and a melting point of 138° C., manufactured by Yamaishi Metal Co., Ltd.

Epoxy resin: jeR871 manufactured by Japan Epoxy Resin K.K.

Curing agent 1: 2-methylaminoethanol with a boiling point of 160° C., manufactured by Nippon Nyukazai Co., Ltd.

Curing agent 2: amine-adduct curing agent (solid) with a melting point of from 120 to 140° C., manufactured by Ajinomoto Fine-Techno Co., Inc.

Curing agent 3: 2,2'-dimethylaminoethanol with a boiling point of 135° C.

Resin sheet: polyimide film of 500 mm×500 mm×75 μm in length×width×thickness with 12.5 μm-thick uncured epoxy resin layers laminated on its opposite surfaces.

Protective film: 25 μm-thick PET sheet.

Copper foil (25 μm thick).

(Via Paste Preparation)

A blend of Cu particles, Sn—Bi based solder particles, epoxy resin, and a curing agent at a blend ratio shown in Table 1 was mixed by a planetary mixer to prepare via paste.

(Multilayer Wiring Board Manufacturing)

Protective films were attached to opposite surfaces of a resin sheet. Then, the resin sheet with the protective films attached thereon was perforated from outside by a laser with 100 or more holes having a diameter of 150 μm.

Subsequently, the prepared via paste was applied to completely fill the through-holes. Then, the protective films on the opposite surfaces were removed to reveal protrusions formed by the via paste partially projecting from the through-holes.

Next, sheets of copper foil were placed on the opposite surfaces of the resin sheet so as to cover the protrusions. Then, a laminate of the resin sheet with the copper foil placed thereon was mounted on a lower die of a hot-pressing die pair via exfoliate paper, heated from a room temperature of 25° C. to a maximum temperature of 220° C. for 60 minutes, kept at 220° C. for 60 minutes, and then cooled to room temperature for 60 minutes. Note that exerted pressure was 3 MPa. In this manner, multilayer wiring boards were obtained.

(Evaluation)

<Resistance Test>

One hundred via-hole conductors formed in each of the obtained multilayer wiring boards were measured for resistance by a four-terminal method. Then, average and maximum resistance values were obtained for the one hundred. Then, average and maximum resistance values were obtained for the one hundred. Note that maximum resistance values less than 2 mΩ were determined as "A", maximum resistance values from 2 to 3 mΩ as "B", and maximum resistance values greater than 3 mΩ as "C". Note that when the maximum resistance values are low, a standard deviation σ of the resistance values is likely to be low as well.

<Delamination Test>

Adhesion of the via-hole conductors was examined by delaminating (or breaking) the copper foil from the surfaces of the obtained multilayer wiring boards. In this case, unsuccessful delamination was determined as "A", difficult but successful delamination as "B", and easy delamination as C.

<Initial Resistance>

Combined connection resistance of one hundred via holes provided in each of the multilayer wiring boards was measured by a four-terminal method. Note that they were determined as "A" when their initial resistance values were less than or equal to 1Ω, "B" when those with initial resistance values less than or equal to 1Ω and those with initial resistance values greater than 1Ω were both present, and "C" when all their initial resistance values were greater than 1Ω.

<Connection Reliability>

The multilayer wiring boards measured for initial resistance were subjected to a temperature cycling test for 500 cycles, and those with the percentage of change from the initial resistance being 10% or less and those with the percentage of change of greater than 10% were determined as "A" and "B", respectively.

The results are shown in Table 1. Also, average resistance values versus Cu/Sn mass ratio are plotted as a graph shown in FIG. 13.

TABLE 1

| | | Paste No. | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Compositions (parts by mass) | Cu Particles | 100 | 100 | 90 | 80 | 65.5 | 60 | 55.8 | 55.8 | 55.8 | 40 | 20 | 0 |
| | Sn42—58Bi Particles | 0 | 0 | 10 | 20 | 34.5 | 40 | 44.2 | 44.2 | 44.2 | 60 | 80 | 100 |
| | Epoxy Resin | 10 | 10 | 10 | 10 | 10 | 10 | 10 | 10 | 10 | 10 | 10 | 10 |

TABLE 1-continued

| | | Paste No. | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| | Curing Agent 1 2-methylaminoethanol | 2 | — | 2 | 2 | 2 | 2 | 2 | — | — | 2 | 2 | 2 |
| | Curing Agent 2 amine-adduct curing agent | — | 2 | — | — | — | — | — | — | — | — | — | — |
| | Curing Agent 3 2-diisopropanolamine | — | — | — | — | — | — | — | 2 | — | — | — | — |
| | Curing Agent 4 2,2'-dimethylaminoethanol | — | — | — | — | — | — | — | — | 2 | — | — | — |
| | Cu/Sn | — | — | 21.43 | 9.52 | 4.52 | 3.57 | 3 | 3 | 3 | 1.59 | 0.60 | 0 |
| Evaluation Results | Ave. Resistance (1via mΩ) | 0.93 | 0.95 | 0.94 | 0.98 | 1.18 | 1.28 | 1.30 | 1.32 | 1.42 | 2.26 | 3.39 | 4.42 |
| | Max. Resistance (mΩ) | 1.30 | 1.40 | 1.30 | 1.35 | 1.55 | 1.67 | 1.80 | 1.80 | 1.90 | 2.96 | 4.20 | 5.66 |
| | Resistance Determination | A | A | A | A | A | A | A | A | A | B | C | C |
| | Delamination Test | C | C | B | B | A | A | A | A | A | A | A | A |
| | Initial Resistance | A | A | A | A | A | A | A | A | A | B | C | C |
| | Connection Reliability | B | B | A | A | A | A | A | A | B | A | A | A |

Figure 13:
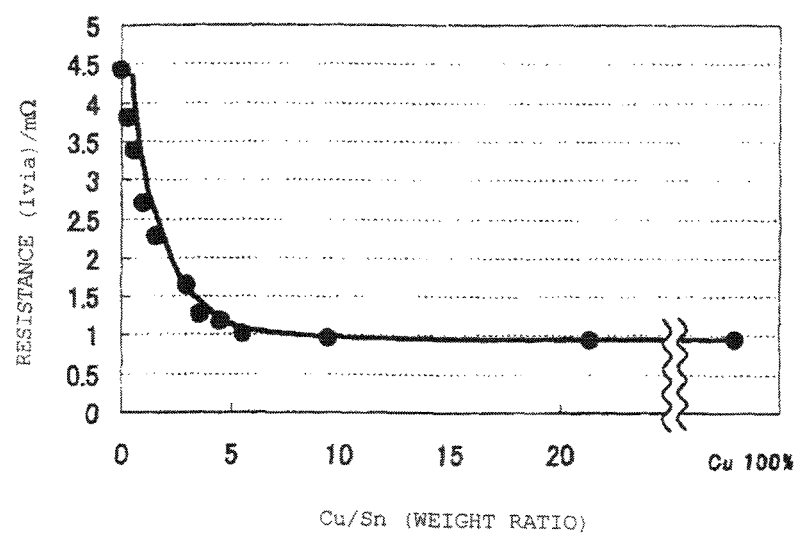
FIG. 13 is a graph showing resistance values (1 via/mΩ) versus the weight ratio Cu/Sn in via-hole conductors obtained by way of example.

From the graph of FIG. 13, it can be appreciated that the resistance value abruptly drops approximately from the weight ratio Cu/Sn 1.59, and also drops approximately from 3. This is possibly because more Cu particles with low resistance are brought into plane contact with one another as the proportion of Cu particles increases. Specifically, it is possibly because less metal with higher resistance than Cu intervenes between adjacent Cu particles.

In other words, for Cu/Sn of less than 1.59, the resistance value abruptly increases, possibly because metal with high resistance intervenes between a number of Cu particles 7.

It can be also appreciated from Table 1 that both the average and maximum resistance values fall to as extremely low as 3 mΩ or less when the proportion of Sn42-58Bi particles is 60% by mass or less and also 2 mΩ or less for 44.2% by mass or less of Sn42-58Bi particles. However, it can be seen that delamination readily occurs when no Sn42-58Bi particles are contained. On the other hand, it is obvious that delamination becomes unlikely to occur as the proportion of Sn42-58Bi particles increases.

It can also be appreciated that low resistance and high reliability are compatible when the proportion of Sn42-58Bi particles is in the range from 10 to 60% by mass. When the proportion of Sn42-58Bi particles is excessively low, there is a reduction in second metal regions around plane contact portions where Cu particles are in contact with one another, resulting in insufficient connection reliability. On the other hand, when the proportion of Sn42-58Bi particles is excessively high, the second metal regions increase, which reduces the plane contact portions where Cu particles are in contact with one another, resulting in a tendency toward higher resistance.

When comparing the multilayer wiring boards obtained using paste Nos. 7 to 9, it can also be appreciated that paste Nos. 7 and 8 with the boiling points of their curing agents being higher than the melting point of 138° C. of Sn42-58Bi particles are more superior in the balance between reduction in the resistance value and increase in the reliability. When the boiling point is lower, an oxidized layer on the solder surface is reduced, so that the curing agent starts volatilization before melting, and therefore the area of its metal portion is reduced, causing a problem with the connection reliability of via holes. Note that the boiling point of the curing agent is desirably 300° C. or less. When it is higher than 300° C., a particular kind of curing agent is required and furthermore its reactivity might be adversely affected.

Figure 14A:
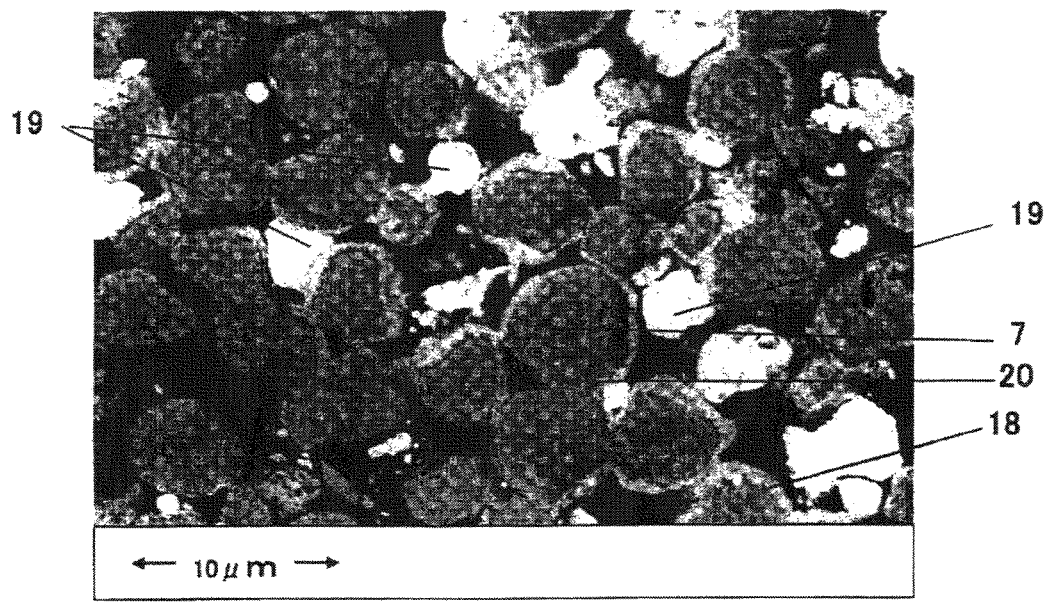
FIG. 14A shows a cross-sectional scanning electron microscope (SEM) photograph of a via conductor of a multilayer wiring board obtained by way of example at 3000-times magnification.
Figure 14B:
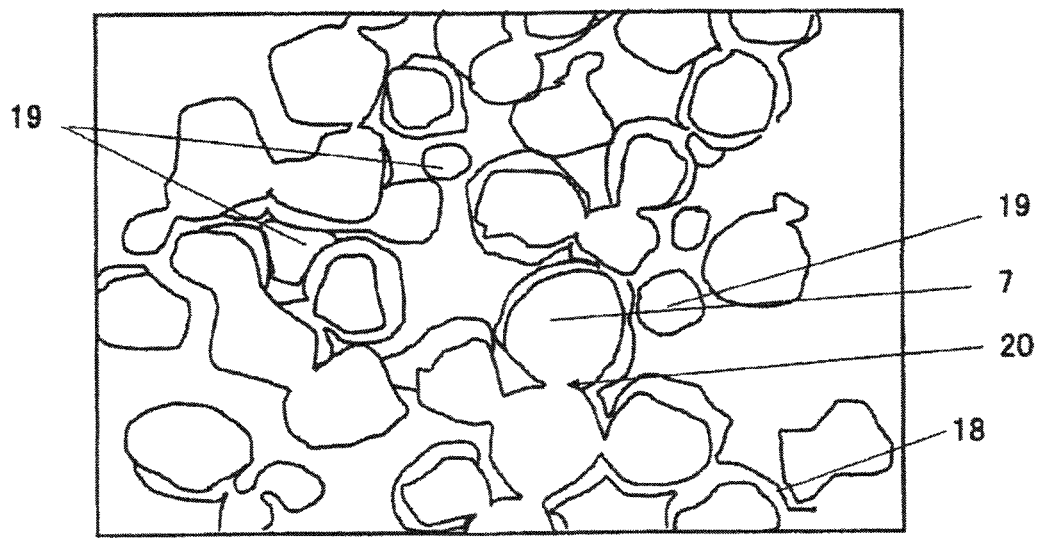
FIG. 14B shows a tracing of the SEM photograph of FIG. 14A.
Figure 15A:
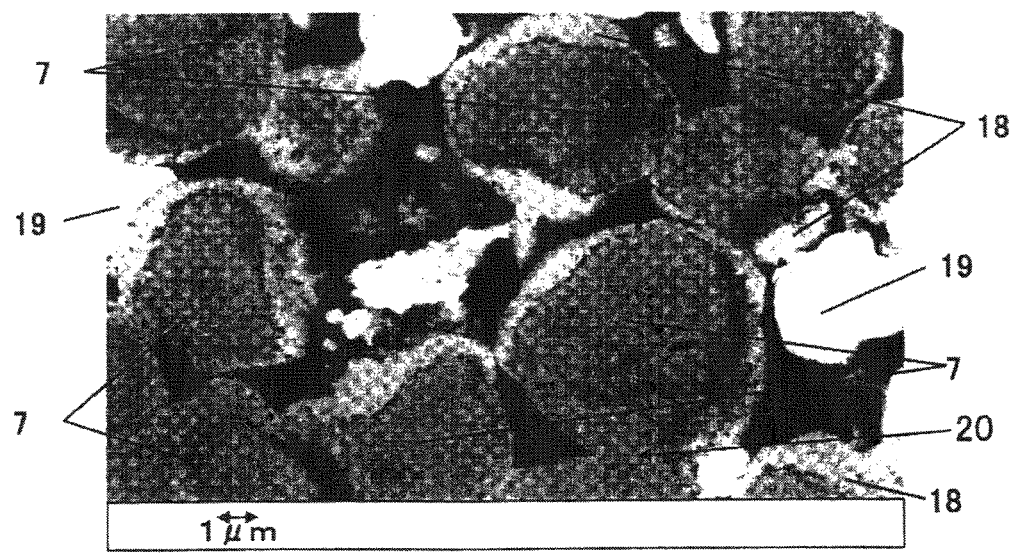
FIG. 15A shows a cross-sectional SEM photograph of the via conductor of the multilayer wiring board obtained by way of example at 6000-times magnification.
Figure 15B:
FIG. 15B shows a tracing of the SEM photograph of FIG. 15A.

Here, cross-sectional scanning electron microscope (SEM) photographs of a via conductor in the multilayer wiring board obtained using paste No. 6 according to the present invention are representatively shown along with their tracings. FIGS. 14A and 15A are SEM photographs at 3000- and 6000-times magnification, respectively. Also, FIGS. 14B and 15B are tracings of FIGS. 14A and 15A, respectively. Furthermore, FIG. 16A is a cross-sectional via conductor image used for an EPMA (electron probe microanalyzer) and FIG. 16B is a tracing thereof.

It can be seen from the figures that the obtained via-hole conductor is highly filled with a number of Cu particles 7, which are in plane contact to form plane contact portions 20. Accordingly, it can be appreciated that a low-resistance conduction path is formed. It can be also appreciated that second metal regions 18 mainly composed of tin (Sn), a tin-copper intermetallic compound, or a tin-copper alloy are formed so as to overlie the plane contact portions 20 or the surfaces of the copper particles 7 or so as to extend over the plane contact portions 20. Moreover, it is obvious that third metal regions 19 mainly composed of Bi with high resistance are substantially out of contact with the Cu particles. In the third metal regions, a high concentration of Bi precipitates, possibly because Sn in the Sn42-58Bi particles form an alloy (e.g., an intermetallic compound) in concert with Cu on the surfaces of the Cu particles 7.

Figure 16A:
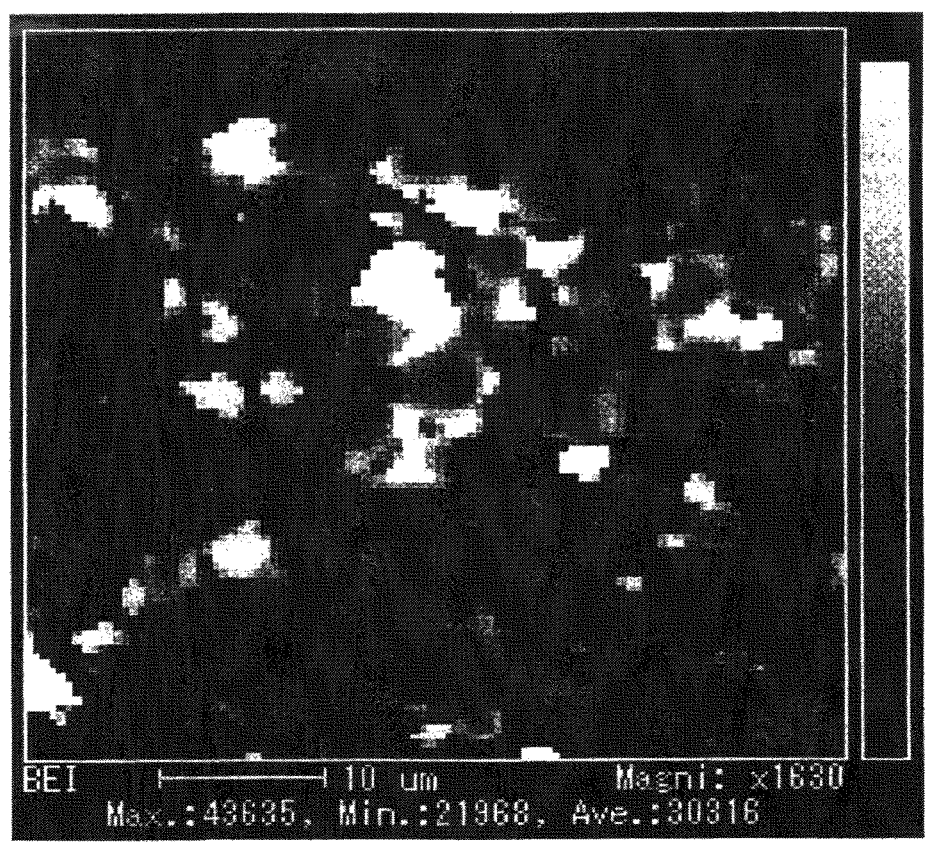
FIG. 16A shows a cross-sectional SEM photograph of the via conductor of the multilayer wiring board obtained by way of example.
Figure 16B:
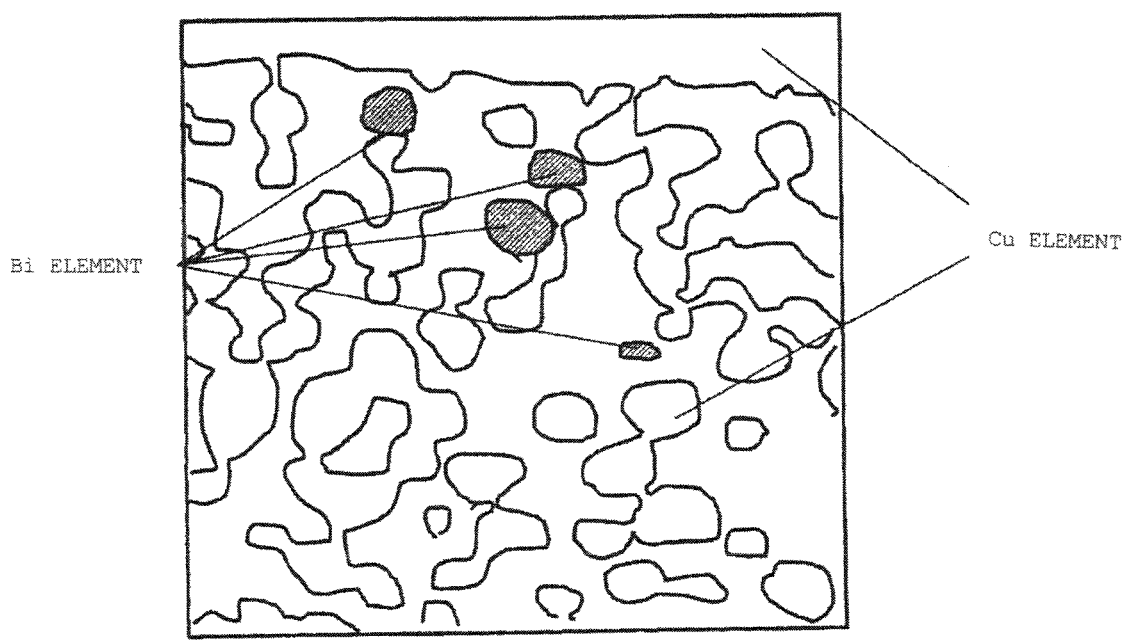
FIG. 16B shows a tracing of the SEM photograph of FIG. 16A.
Figure 17A:
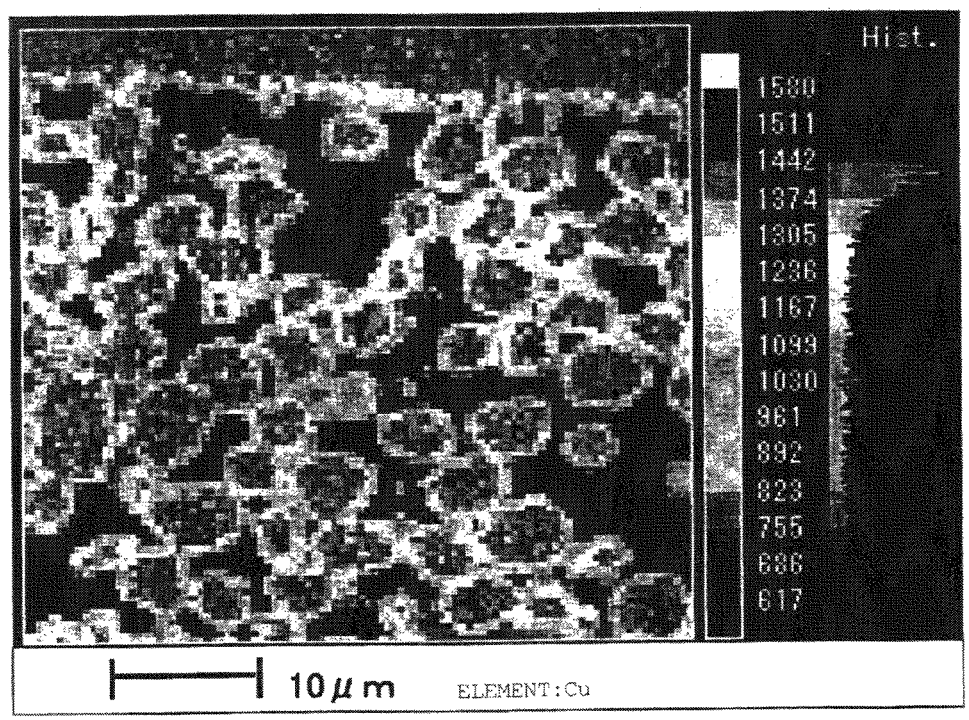
FIG. 17A shows an image obtained by Cu-element mapping from the EPMA image of FIG. 16A.
Figure 17B:
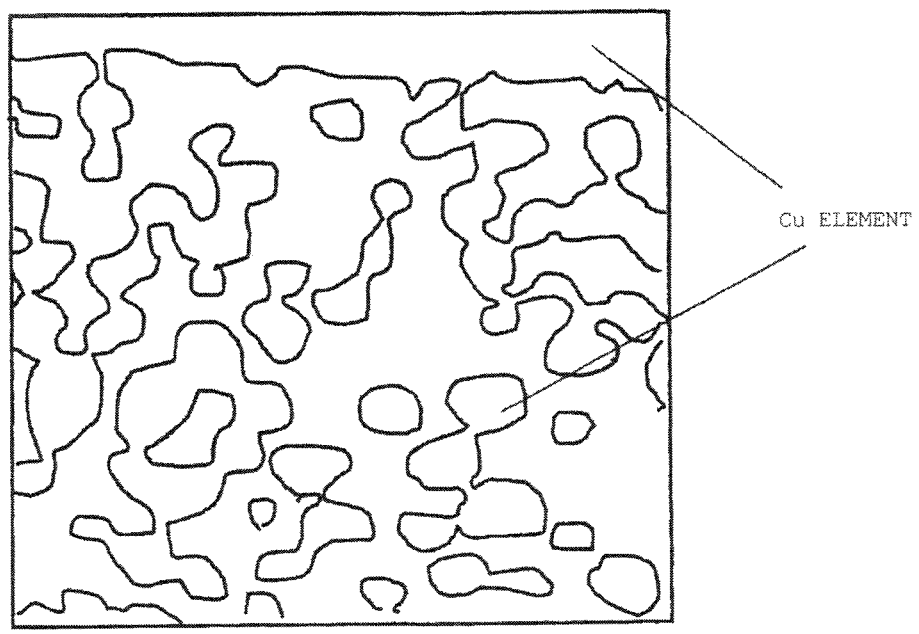
FIG. 17B shows a tracing of the mapping image of FIG. 17A.

FIG. 17A shows an image obtained by Cu-element mapping from the EPMA image of FIG. 16A, and FIG. 17B shows a tracing thereof.

From FIGS. 17A and 17B, it can be appreciated that the obtained via-hole conductor has a number of Cu particles randomly present in high density. It can be also appreciated that the Cu particles are in direct plane contact with one another to establish electrical connection.

Figure 18A:
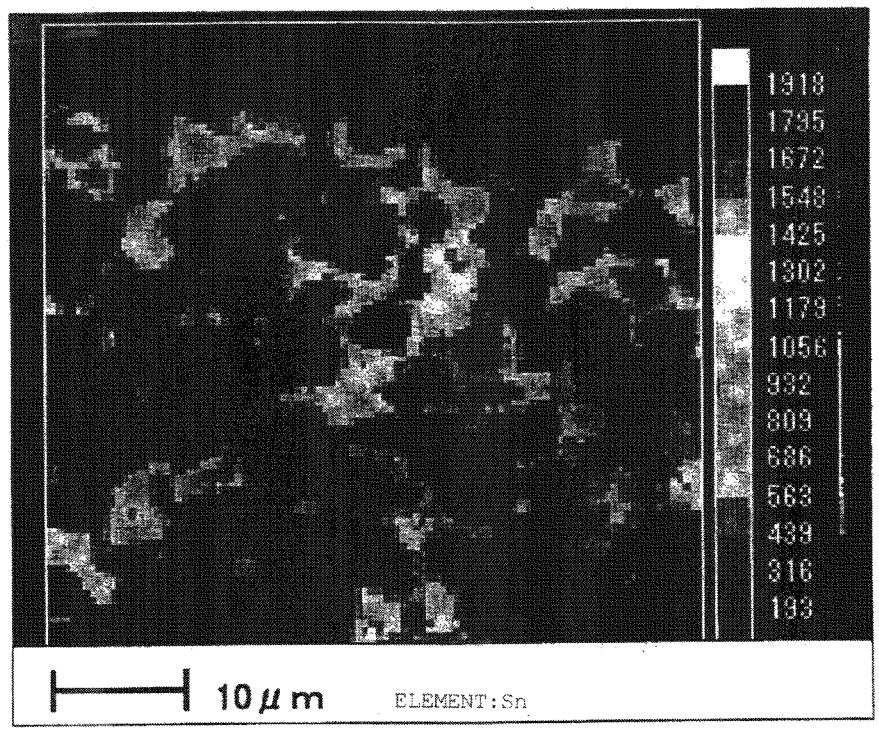
FIG. 18A shows an image obtained by Sn-element mapping from the EPMA image of FIG. 16A.
Figure 18B:
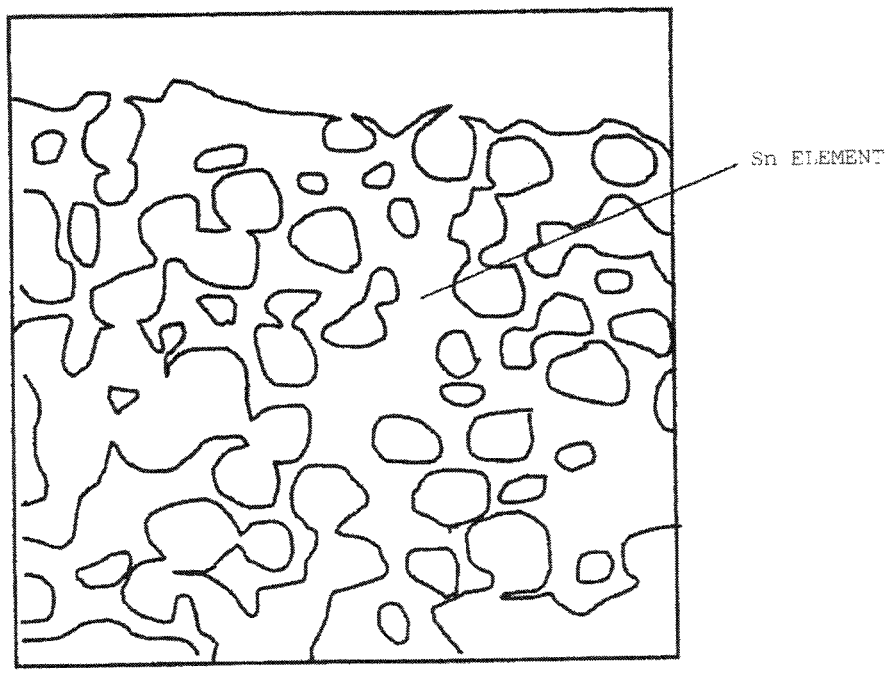
FIG. 18B shows a tracing of the mapping image of FIG. 18A.

FIG. 18A shows an image obtained by Sn-element mapping from the EPMA image of FIG. 16A, and FIG. 18B shows a tracing thereof.

From FIGS. 18A and 18B, it can be appreciated that plane contact portions, in which a number of Cu particles are in direct contact with one another, have second metal regions formed thereon so as to extend over the plane contact portions.

Note that in FIGS. 18A and 18B, the Cu particles are shown as if most of their surfaces were covered by the second metal regions. However, in the EPMA image, epoxy resin is transparent and therefore not only Sn elements in the surface layer to be observed but also Sn elements in the backing layer are detected. Accordingly, in fact, rather than covering most of the surfaces of the Cu particles, the second metal regions are present on the surfaces of the Cu particles and even extending over the plane contact portions. This can be seen also from the SEM images shown in FIGS. 14A to 16A. Also, in such a structure, stress generated in the relatively hard second metal regions is absorbed by soft Cu particles. Therefore, cracks generated in the second metal regions are inhibited from propagating and widening.

Figure 19A:
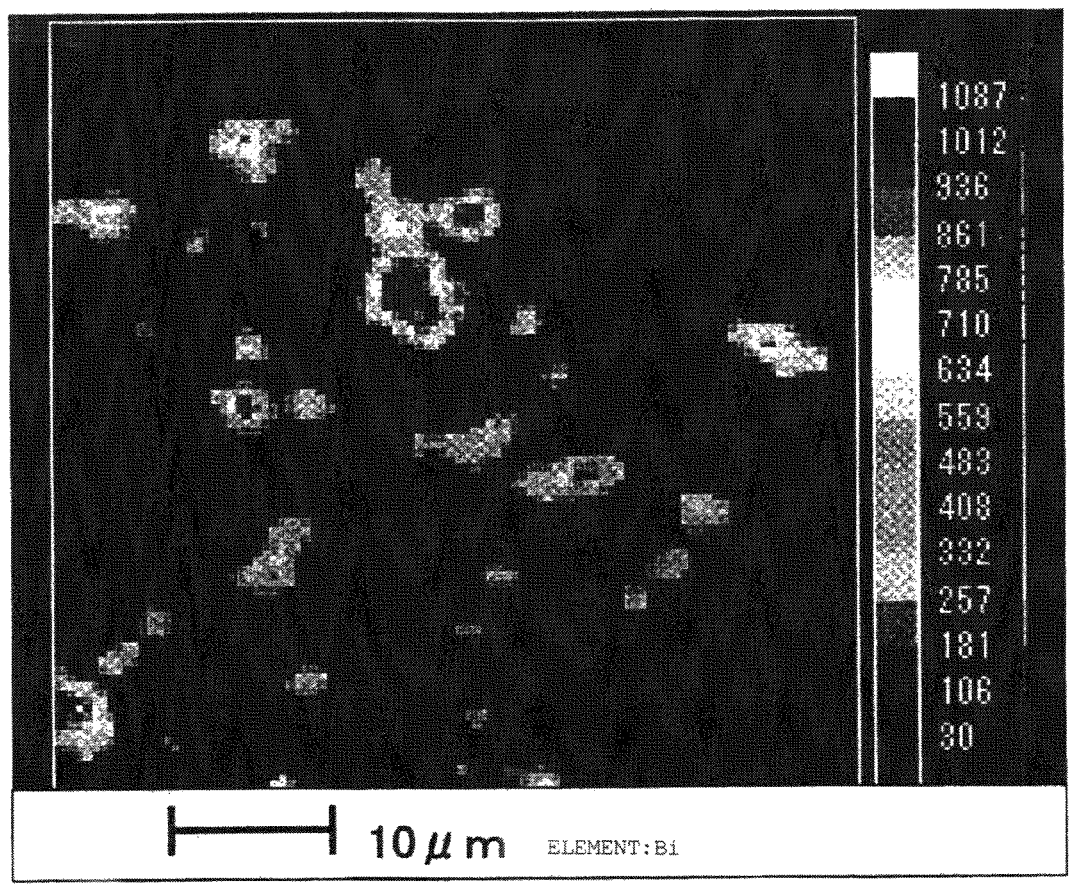
FIG. 19A shows an image obtained by Bi-element mapping from the EPMA image of FIG. 16A.
Figure 19B:
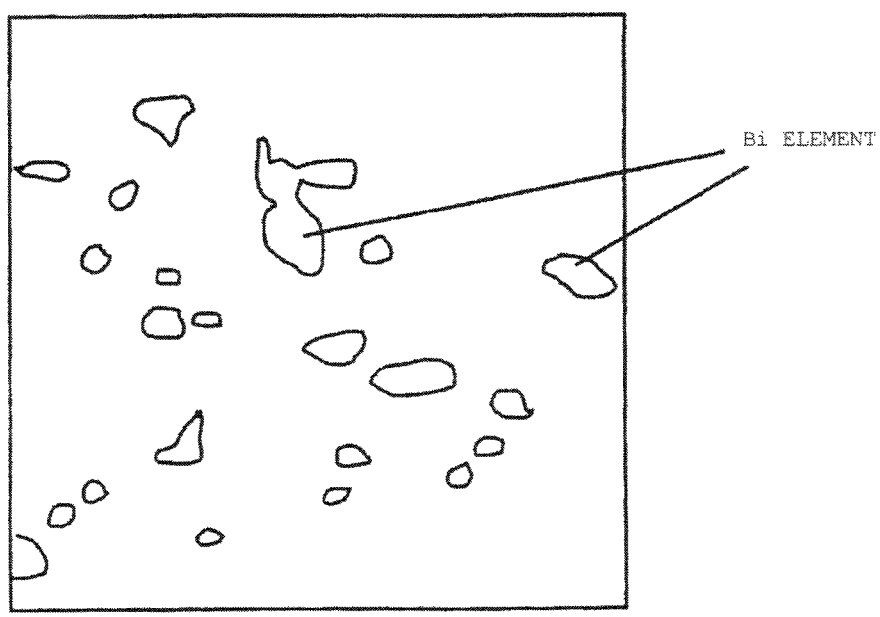
FIG. 19B shows a tracing of the mapping image of FIG. 19A.

FIG. 19A shows an image obtained by Bi-element mapping from the EPMA image of FIG. 16A, and FIG. 19B shows a tracing thereof.

From FIGS. 19A and 19B, it can be seen that Bi is present so as to cause third metal regions not to contact Cu particles. From this, it can be appreciated that Bi with high resistance does not affect the conduction path formed by the Cu particles in contact with one another.

[Comparisons with the Conventional Art]

Described next are resistance comparison results between the via-hole conductor of the multilayer wiring board in the example described above and the via-hole conductors according to Patent Document 4 mentioned above.

Figure 20:
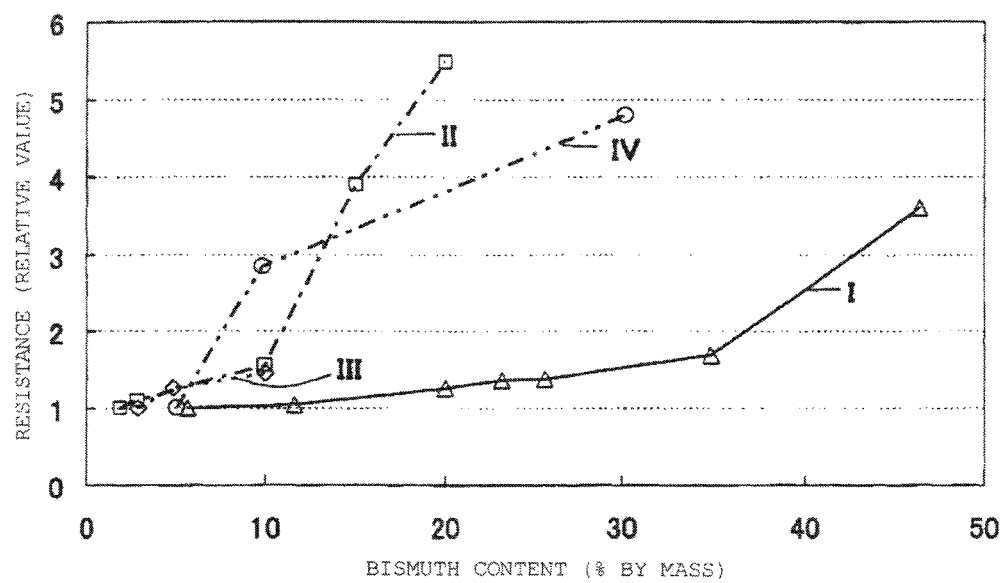
FIG. 20 is a graph comparing resistance between conventionally known via-hole conductors obtained from conductive paste of Patent Document 4 and a via-hole conductor according to the invention of the present application.
Figure 21:
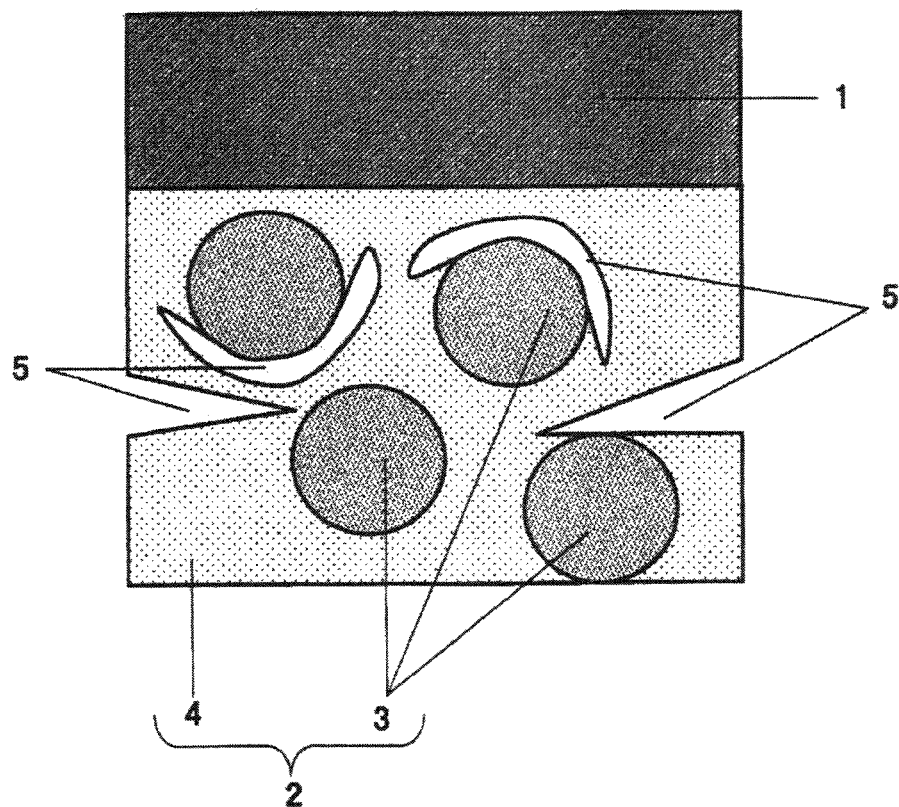
FIG. 21 is a schematic cross-sectional view describing a cross section of a conventional via-hole conductor.

FIG. 20 is a graph comparing resistance between the via-hole conductor of the multilayer wiring board in the example and the via-hole conductors of the multilayer wiring board according to Patent Document 4.

In FIG. 20, the horizontal axis (X-axis) represents the bismuth content of the via-hole conductors in percent by mass. The vertical axis (Y-axis) represents relative values of the via-hole conductor resistance (values relative to 1, the lowest resistance).

In FIG. 20, line I represents changes of resistance corresponding to results in "Table 1" of Example 1, as expressed by relative values.

On the other hand, line II in FIG. 20 represents changes of resistance of (Sn-2Ag-0.5Cu-20Bi) in "Table 1" of Patent Document 4, as expressed by relative values. Also, line III in FIG. 20 represents changes of resistance of (Sn-2Ag-0.5Cu-15Bi) in "Table 1" of Patent Document 4, as expressed by relative values. Moreover, line IV in FIG. 20 represents changes of resistance of (Sn-58Bi) in "Table 1" of Patent Document 4, as expressed by relative values.

From FIG. 20, it can be appreciated that, in the case of the via-hole conductor of the multilayer wiring board of the present example represented by line I, the via hole resistance does not increase significantly even if the bismuth content of the via-hole conductor increases. This is possibly because the via-hole conductor of the multilayer wiring board of the present example has a joined unit formed of copper particles in direct plane contact with one another, and the joined unit electrically connects a plurality of wirings. Thus, the resistance does not increase significantly even if the bismuth content increases.

On the other hand, it can be appreciated that, in the case of the via-hole conductors of the multilayer wiring board in "Table 1" of Patent Document 4, as represented by lines II, III, and IV, the via hole resistance increases abruptly as the bismuth content of the via-hole conductors increases. This is possibly because, in the case of the via-hole conductors of the multilayer wiring board in Patent Document 4, copper particles are electrically connected via a high-resistance metal component. A possible reason for this is that "a molten metal component is involved in connection", as inferred from paragraph [0015] of Patent Document 4. Specifically, the high-resistance metal component present between copper particles becomes thicker as the bismuth content increases more and more.

As described above, in the case of the via-hole conductor of the multilayer wiring board of the present example, copper particles form a joined unit by contacting one another via plane contact portions in which they are in plane contact with one another, the joined unit electrically connects a plurality of wirings, and therefore, even if the bismuth content of the via-hole conductor increases, the via hole resistance increases neither abruptly nor significantly, so that low resistance is maintained.

INDUSTRIAL APPLICABILITY

The present invention makes it possible to further reduce the cost and size of multilayer wiring boards for use in, for example, cell phones, and also further enhance their functionality and reliability. Furthermore, optimal via pastes are proposed in view of reduction in diameter of vias and formation of via paste reaction products, which also contributes to the size reduction and the reliability enhancement of the multilayer wiring boards.

The invention claimed is:

1. A multilayer wiring board comprising at least one insulating resin layer, a first wiring laid on a first surface of the insulating resin layer, a second wiring laid on a second surface of the insulating resin layer, and at least one via-hole conductor provided in a through-hole and configured to pierce the insulating resin layer for electrically connecting the first wiring and the second wiring, wherein:

the via-hole conductor includes metal portion and resin portions, the resin portion forming a matrix in which the metal portions are embedded, the metal portion includes:

first metal regions including a joined unit made of copper particles for forming a path electrically connecting the first wiring and the second wiring;

second metal regions mainly composed of at least one metal selected from the group consisting of tin, a tin-copper alloy, and a tin-copper intermetallic compound; and third metal regions mainly composed of bismuth and in contact with the second metal regions, the copper particles forming the joined unit are in plane contact with one another to form plane contact portions, the plane contact portions are at least partially covered by the second metal regions, and the second metal regions at least partially are in contact with the first metal regions, and the at least one via-hole conductor is sandwiched between the first and second wirings which at least partially cover the top end and bottom end of the through-hole.

2. The multilayer wiring board according to claim 1, wherein the volume percent of the copper particles in the via-hole conductor is in the range from 30 to 90%.

3. The multilayer wiring board according to claim 1, wherein the insulating resin layer is a laminated heat-resistant resin sheet obtained by laminating cured resin layers on surfaces of a heat-resistant resin sheet.

4. The multilayer wiring board according to claim 1, wherein the insulating resin layer is a fiber-containing resin sheet including a fiber sheet and cured resin with which the fiber sheet is impregnated.

5. The multilayer wiring board according to claim 1, wherein the weight ratio (Cu/Sn) of copper (Cu) to tin (Sn) in the metal portion is in the range from 1.59 to 21.43.

6. The multilayer wiring board according to claim 1, wherein the first metal regions are out of contact with the third metal regions.

7. The multilayer wiring board according to claim 1, wherein the joined unit made of copper particles is configured to deform when force is applied to said joined unit.

8. The multilayer wiring board according to claim 1, wherein the copper particles are in contact with the pair of wirings via plane contact portions.

9. A multilayer wiring board manufacturing method comprising:
- a first step of covering surfaces of an insulating resin sheet with protective films;
- a second step of forming at least one through-hole by perforating the insulating resin sheet via either of the protective films;
- a third step of filling the through-hole with via paste including copper particles, tin-bismuth based solder particles, and thermally curable resin;
- a fourth step of removing the protective films after the third step, thereby revealing protrusions formed by the via paste partially projecting from the through-hole;
- a fifth step of placing metal foil on at least one surface of the insulating resin sheet so as to cover the protrusions;
- a sixth step of subjecting the metal foil to compression bonding onto the surface of the insulating resin sheet to compress the via paste by way of the protrusions at a temperature lower than the melting point of the tin-bismuth based solder particles, thereby forming first metal regions including joined units made of the copper particles, the first metal regions including plane contact portions formed by the copper particles in plane contact with one another; and
- a seventh step of heating the via paste to the melting point of the tin-bismuth based solder particles or higher after the sixth step, thereby generating second metal regions mainly composed of at least one metal selected from the group consisting of tin, a tin-copper alloy, and a tin-copper intermetallic compound, and third metal regions mainly composed of bismuth, wherein the second metal regions are at least partially in contact with the first metal regions, and the third metal regions are in contact with the second metal regions.

10. The multilayer wiring board manufacturing method according to claim 9, wherein the thermally curable resin is epoxy resin.

11. The multilayer wiring board manufacturing method according to claim 10, wherein the epoxy resin contains a curing agent which is an amine compound having at least one or more hydroxyl groups in its molecules.

12. The multilayer wiring board manufacturing method according to claim 11, wherein the amine compound has a boiling point greater than or equal to the melting point of the tin-bismuth based solder particles, the boiling point being 300° C. or lower.

13. The multilayer wiring board manufacturing method according to claim 9, wherein the insulating resin sheet is a prepreg including a fiber sheet and uncured resin with which the fiber sheet is impregnated.

14. The multilayer wiring board manufacturing method according to claim 9, wherein the insulating resin sheet is an uncured resin layer-containing sheet having uncured resin layers provided on a heat-resistant resin sheet.

15. The multilayer wiring board manufacturing method according to claim 9, further comprising the step of configuring the joined unit made of copper particles to deform when force is applied to said joined unit.

* * * * *